(12) United States Patent
Omori et al.

(10) Patent No.: US 7,109,500 B2
(45) Date of Patent: Sep. 19, 2006

(54) MASK PATTERN CORRECTION METHOD, SEMICONDUCTOR DEVICE MANUFACTURING METHOD, MASK MANUFACTURING METHOD AND MASK

(75) Inventors: Shinji Omori, Kanagawa (JP); Kaoru Koike, Ibaraki (JP); Shigeru Moriya, Kanagawa (JP); Isao Ashida, Kanagawa (JP)

(73) Assignee: Sony Corporation, (JP)

( * ) Notice: Subject to any disclaimer, the term of this patent is extended or adjusted under 35 U.S.C. 154(b) by 169 days.

(21) Appl. No.: 10/509,230

(22) PCT Filed: Mar. 20, 2003

(86) PCT No.: PCT/JP03/03455

§ 371 (c)(1),
(2), (4) Date: Sep. 24, 2004

(87) PCT Pub. No.: WO03/083913

PCT Pub. Date: Oct. 9, 2003

(65) Prior Publication Data

US 2005/0124078 A1    Jun. 9, 2005

(30) Foreign Application Priority Data

Mar. 28, 2002  (JP)  .............................. 2002-092612

(51) Int. Cl.
*H01L 21/027* (2006.01)
*G03F 9/00* (2006.01)

(52) U.S. Cl. .................... 250/492.22; 250/492.23; 250/492.2; 430/5; 438/551; 716/19; 716/21

(58) Field of Classification Search ........... 250/492.22, 250/492.23, 492.2; 430/5; 438/551; 716/19, 716/21
See application file for complete search history.

(56) References Cited

U.S. PATENT DOCUMENTS 5,831,272 A    11/1998    Utsumi (Continued)

FOREIGN PATENT DOCUMENTS

JP    9-218032    2/1996

(Continued)

OTHER PUBLICATIONS

International Search Report dated Jul. 8, 2003.

*Primary Examiner*—Nikita Wells
(74) *Attorney, Agent, or Firm*—Rader, Fishman & Grauer PLLC; Ronald P. Kananen

(57) ABSTRACT

A mask pattern correction method capable of preventing a position of a pattern from deviating by deformation of a mask due to gravity, a mask production method, a mask, and a production method of a semiconductor device capable of forming a fine pattern with high accuracy are provided. A mask pattern correction method, a mask production method, a mask produced thereby and a production method of a semiconductor device using the mask include a step of creating first position data indicating positions of a plurality of marks when supporting a first thin film having the marks in a state where a first surface directs upward, a step of creating second position data indicating mark positions when supporting the first thin film in a state where a second surface directs upward, a step of obtaining a transfer function for converting the first position data to the second position data, and a step of correcting a mask pattern as a shape of exposure beam transmission portions formed on a second thin film by using an inverse function of the transfer function.

26 Claims, 22 Drawing Sheets

U.S. PATENT DOCUMENTS

| | | | |
|---|---|---|---|
| 6,787,785 B1 * | 9/2004 | Moriya et al. | 250/492.23 |
| 6,883,158 B1 * | 4/2005 | Sandstrom et al. | 716/19 |
| 2001/0049811 A1 | 12/2001 | Taoka | |
| 2002/0000524 A1 | 1/2002 | Suzuki et al. | |
| 2005/0014076 A1 * | 1/2005 | Omori | 430/5 |

FOREIGN PATENT DOCUMENTS

| | | |
|---|---|---|
| JP | 8-203817 | 8/1996 |
| JP | 11-135423 | 5/1999 |
| JP | 11-305416 | 11/1999 |
| JP | 2001-23880 | 1/2001 |
| JP | 2001-265012 | 9/2001 |
| JP | 2001-350250 | 12/2001 |
| JP | 2001-351854 | 12/2001 |

* cited by examiner

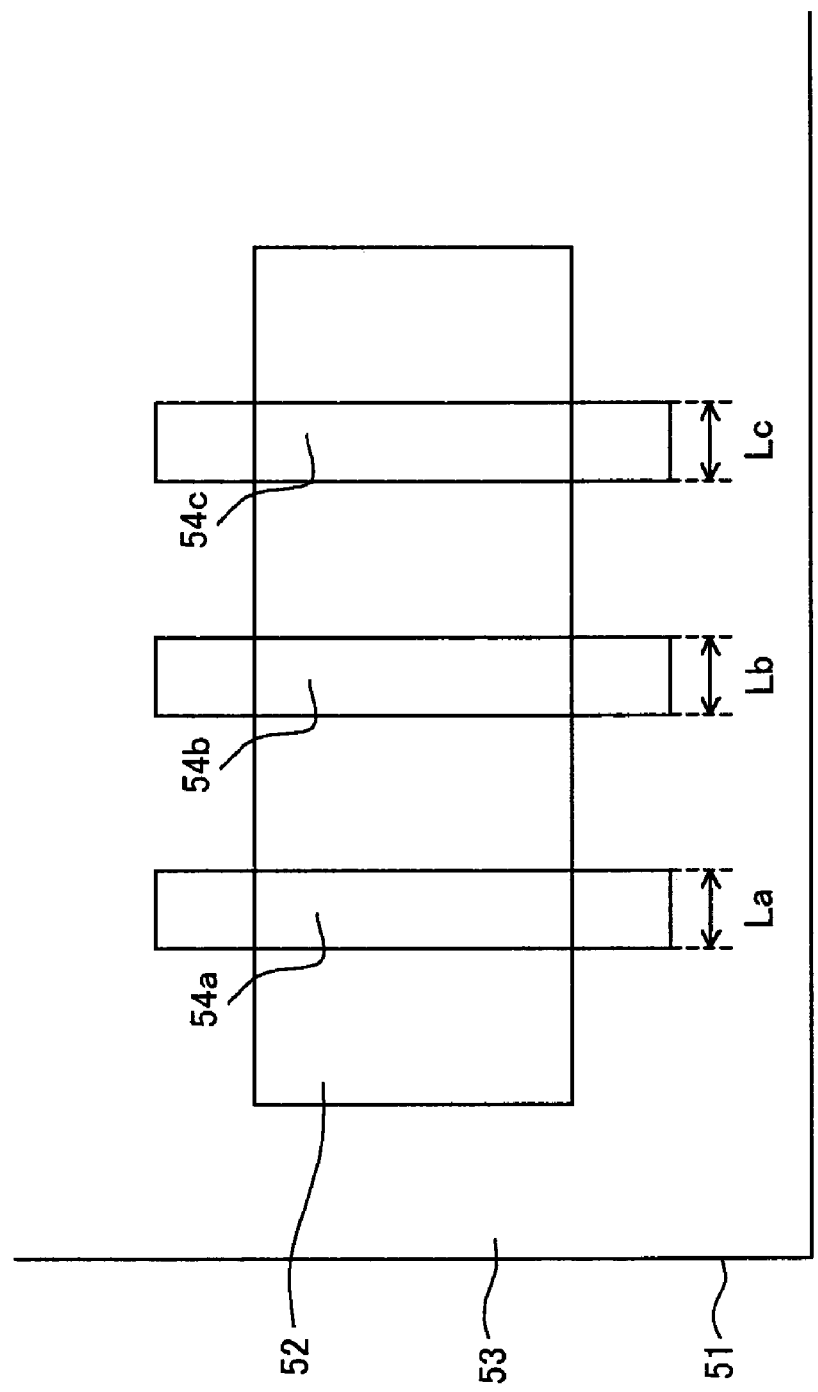

MASK PATTERN CORRECTION METHOD, SEMICONDUCTOR DEVICE MANUFACTURING METHOD, MASK MANUFACTURING METHOD AND MASK

TECHNICAL FIELD

The present invention relates to a mask pattern correction method of a mask used in a lithography step, a production method of a semiconductor device, a mask production method and a mask, and particularly relates to a mask pattern correction method capable of preventing positional deviation of a pattern by the mask deformation due to gravity.

BACKGOUND ART

As an exposure technique of the next generation to take over photolithography, transfer type exposure methods using charged particles, such as an electron beam and an ion beam, have been developed. A mask having a thin film region (membrane) is used in common in the new techniques. The thickness of a membrane on the mask surface side is 100 nm to 10 µm or so, and a transfer pattern is arranged on the membrane. The membrane is formed, for example, by partially performing etching on a mask material including a silicon wafer from the mask back surface side, and mask blanks of non-etched portions become supporting portions of the membrane.

Those formed with a transfer pattern by formed holes on the membrane itself are called stencil masks (refer to, for example, H. C. Pfeiffer, Jpn. J. Appl. Phys. 34,6658 (1995)). While, those formed with a transfer pattern by processing a scatterer of a metal thin film, etc. stacked on the membrane are called membrane masks (refer to, for example, L. R. Harriott. J. Vac. Sci. Technol. B 15,2130 (1997)).

In transfer type lithography, there are the methods of projecting by reducing a charged particle ray transmitting a mask by an electron/ion optical system (SCALPEL of Lucent Technologies, PREVAIL of IBM, EB (electron beam) Stepper of Nikon Corporation, and ion beam transfer lithography, etc.) and a method of transferring to a wafer closely placed immediately below a mask without an electron/ion optical system (LEEPL by Tokyo Seimitsu Co., Ltd., etc.). In either method, it is extremely important to produce a mask with high positional accuracy of a pattern.

Various variations are possible as methods of producing the masks, and a typical production flow of a stencil mask and a membrane mask will be explained. In the case of a stencil mask, first, as shown in FIG. 1A, a silicon oxide film 102 is formed on a back surface of a SOI wafer 101. The SOI (silicon on insulator or semiconductor on insulator) wafer 101 has a silicon layer 105 on a silicon wafer 103 via a silicon oxide film (buried oxide film) 104. While not illustrated, etching is performed on the silicon oxide film 102.

Next, as shown in FIG. 1B, etching is performed on the silicon wafer 103 from the back surface of the SOI wafer 101. The etching is performed until reaching to the silicon oxide film 104 by using the silicon oxide film 102 as a mask. Since etching speeds of silicon and silicon oxide differ by digits, the silicon wafer 103 is selectively etched on the silicon oxide film 104 and silicon oxide film 102. The etching stops on the silicon oxide film 104.

Next, as shown in FIG. 1C, the silicon oxide film 104 exposed by the etching on the silicon wafer 103 is removed. As a result, a membrane 106 made by silicon is formed. The silicon wafer 103 on portions for sectionalizing the membrane 106 become beams 107 to support the membrane 106. The silicon oxide film 104 is removed, for example, by wet etching using hydrofluoric acid. Also, the silicon oxide film 102 is also removed by etching. While not illustrated, the membrane 106 and the beam 103 are not formed near a rim of the SOI wafer 101, and the silicon wafer left on this portion is used as a supporting frame of the mask.

Next, as shown in FIG. 1D, a resist 108 is applied on the silicon layer 105 including the membrane 106. Next, as shown in FIG. 1E, a mask master (mask blanks) applied with the resist 108 is fixed to an electron beam drawing machine, and a mask pattern is drawn on the resist 108. The mask is fixed to the electron beam drawing machine by a mask holding method applied in the electron beam drawing machine, for example, a mechanical clamp, vacuum chuck or electrostatic chuck, etc., but the mask surface (the resist 108 side) directs upward in any case.

Next, as shown in FIG. 1F, etching is performed on the silicon layer 105 by using the resist 108 as a mask, and holes 109 are formed by a transfer pattern. After that, by removing the resist 108, a stencil mask 110 is formed. The formed stencil mask 110 is fixed to an exposure apparatus, so that the side with the beams 107 and supporting frame becomes an upper side and the membrane 106 becomes lower side.

A charged particle ray is irradiated from the back surface side (the beam 107 side) of the stencil mask 110, and a pattern is transferred on the wafer by the charged particle ray transmitted through the holes 109. Particularly in an unmagnified exposure method, such as LEEPL, the membrane 106 and the wafer have to be close to each other and the membrane 106 inevitably becomes a lower surface side.

On the other hand, when producing a membrane mask, first, as shown in FIG. 2A, silicon nitride films 112a and 112b are formed on both surfaces of a silicon wafer 111, for example, by the chemical vapor deposition (CVD). The silicon nitride film 112a on the mask front surface side becomes a membrane material, and the silicon nitride film 112b on the mask back surface side becomes an etching mask of the silicon wafer 111.

A tungsten layer 114 is formed on the silicon nitride film 112a, for example, via a chrome layer 113. The chrome layer 113 becomes an etching stopper layer when performing etching on the tungsten layer 114, and the tungsten layer 114 becomes a scatterer of a charged particle ray.

Next, as shown in FIG. 2B, etching is performed on the silicon nitride film 112b on the mask back surface side, and the silicon nitride film 112b on the membrane formation region is removed. Next, as shown in FIG. 2C, a resist 115 is applied on the tungsten layer 114. Next, as shown in FIG. 2D, etching is performed on the silicon wafer 111 by using the silicon nitride film 112b as a mask to form beams 116.

Next, as shown in FIG. 2E, the mask blanks are fixed to the electron beam drawing machine, and a mask pattern is drawn on the resist 115. In the same way as in the case of producing a stencil mask, the mask is fixed by a mask holding method in accordance with the electron beam drawing machine and, in either holding method, the mask front surface (the resist 115 side) faces upward.

Next, as shown in FIG. 2F, etching is performed on the tungsten layer 114 by using the resist 115 as a mask, and the resist 115 is removed. Furthermore, by performing etching on the chrome layer 113 by using the tungsten layer 114 as a mask, a transfer pattern is formed on a membrane 117 composed of a silicon nitride film 112a and a membrane mask 118 is formed.

The formed membrane mask 118 is fixed to an exposure apparatus, so that the beams 116 side becomes an upper side and the membrane 117 becomes the lower side in the same way as in the stencil mask. A charged particle beam is irradiated from the back surface side (the beams 116 side) of the membrane mask 117 and a pattern is transferred to a wafer by the charged particle beam transmitted through the membrane 117 on portions other than the scatterer (the tungsten layer 114).

FIG. 3 is a plan view of an example of a stencil mask. As shown in FIG. 3, the membranes 106 sectionalized by the beams 107 are arranged at the center portion of the silicon wafer 103 (supporting frame). Note that thick beams 107a and the beams 107 have a common sectional configuration and only the width is different.

FIG. 4 is an enlarged perspective view of a part (A) of FIG. 3. FIG. 5 is an enlarged view of the membrane 106 in FIG. 4. As shown in FIG. 5, a predetermined pattern of holes 109 are formed on the membrane 106. A charged particle beam transmits the holes 109. Note that a part S between the dotted line and the beams 107 shown in FIG. 5 is also called a skirt and a pattern is normally not formed thereon.

As explained above, in either of the stencil mask and the membrane mask, the mask is reversed upside down during mask pattern drawing and while in use (at exposure). When drawing a mask pattern by an electron beam on the resist, as shown in FIG. 6A, it is held by a holding means 123, so that the surface (the membrane 122 side) of the mask 121 faces upward. When exposing by an exposure apparatus, the mask surface faces downward as shown in FIG. 6B.

As shown in FIG. 7, the membrane 122 bends due to gravity, so that the upper surface side shrinks and the lower surfaces side extends. The z-axis in FIG. 7 indicates the vertical direction. Due to the deformation by gravity, even if a mask pattern is drawn at an accurate position with the mask surface facing upward, the position of the pattern deviates when performing exposure after turning the mask upside down.

An effect given by the inversion of flexure due to gravity to positional accuracy of the mask pattern is taken up as to a photomask, for example, in the Japanese Unexampled Patent Publication No. 6-18220. Also, a similar problem is also pointed out on a stencil mask and a membrane mask (for example, refer to C. f. Chen et al., J. Vac. Sci. Technol. B 19,2646 (2001)).

In the latter article, deformation of a mask is calculated by a finite limit simulation. From the result, two methods are proposed: (1) the mask front surface faces upward also during exposure as shown in FIG. 6A and (2) exposure is performed with the mask front surface facing downward as shown in FIG. 6B but the thick beams 107a portion shown in FIG. 3 are also supported by an electrostatic chuck.

However, either of the methods requires a complicated and precise mask holding mechanism, which consequently leads to an increase of costs of the apparatus. Also, as explained above, in the case of unmagnified near exposure, the method (1) cannot be applied because the membrane and wafer are close. Also in other exposure methods, it is not verified whether the mask holding methods of (1) and (2) are actually possible or not.

On the other hand, in X-ray lithography (PXL: proximity X-ray lithography), a method of correcting deformation of a mask in advance at the time of electron beam drawing has been proposed (refer to the Japanese Unexamined Patent Publication No. 8-203817). Note that in this publication, not gentle deformation due to gravity in accordance with a position on a mask, but positional deviation in a fine region caused by a stress difference between a membrane and X-ray absorbance is focused. Here, the membrane is, for example, a silicon nitride film or a silicon carbide film, and the X-ray absorbance is a metal layer made of tantalum, tungsten or gold, etc.

According to the method, electron beam drawing is performed by following design data of a mask pattern to produce one mask. The mask is used for performing exposure on a wafer and positional deviation of the pattern is measured. A transfer function S expressing relation of a drawn pattern position $(x_n, y_n)$ and a completed pattern position $(X_n, Y_n)$ on the mask is obtained by using the mask. Namely, a function S for standing $(X_n, Y_n)=S(x_n, Y_n)$ is obtained.

To attain a pattern position based exactly on designed data on the mask, electron beam drawing is performed by data obtained by converting the design data by an inverse function of the transfer function S to produce a mask again. In this method, two masks have to naturally be produced for one design data, which is not preferable in terms of a production time, labor hour and costs. Considering the yield of a PXL mask, production has to be repeated for more than a few samples to complete one mask, so that production of PXL masks by this method actually has not been widely spread.

DISCLOSURE OF THE INVENTION

The present invention was made in consideration of the above problems and has an object to provide a mask pattern correction method and a mask production method capable of preventing a pattern position from deviating because of deformation of a mask due to gravity.

Also, the present invention has an object to provide a production method of a semiconductor device capable of forming a fine pattern with high accuracy.

Furthermore, the present invention has an object to provide a mask wherein positional deviation of a pattern due to an effect of gravity is prevented.

To attain the above object, a mask pattern correction method of the present invention is characterized by including a step of creating first position data indicating positions of a plurality of marks when supporting a first thin film having the plurality of marks in a state where a first surface thereof directs upward; a step of creating second position data indicating positions of the marks when supporting the first thin film in a state where a second surface thereof directs upward; a step of obtaining a transfer function for converting the first position data to the second position data; and a step of correcting a mask pattern as a shape of an exposure beam transmission portion to be formed on a second thin film by using an inverse function of the transfer function.

Preferably, the step of creating the first position data includes a step of actually measuring positions of the marks formed on the first thin film. Alternately, a step of drawing the marks on a resist on the first thin film and forming holes on the first thin film by using the resist as an etching mask is included. Alternately, a step of actually measuring positions of the marks drawn on the resist is included. Alternately, the first position data is created by a simulation.

Preferably, a step of actually measuring positions of the marks formed on the first thin film is included. Alternately, a step of forming second surface side marks on the second surface side of the first thin film, and actually measuring positions of the second surface side marks is included. Alternately, a step of making the first surface face into an exposure surface and transferring the marks on the exposure surface by an exposure beam from the second surface side, and a step of actually measuring positions of the marks transferred to the exposure surface are included.

Alternately, a step of applying a resist on a wafer, a step of irradiating an exposure beam from the second surface side to the first thin film and performing exposure and development on the resist; a step of forming marks on the wafer by performing etching on the wafer by using the resist as an etching mask; and a step of actually measuring positions of the marks formed on the wafer are included.

Alternately, the second position data is created by a simulation.

As a result, it becomes possible to prevent a position of a pattern from deviating by the mask deformation due to gravity. According to the mask pattern correction method of the present invention, even when flexure of the mask is reversed at mask pattern drawing and at exposure, the mask pattern at exposure becomes exactly at a position of designed data.

To attain the above object, a production method of a semiconductor device of the present invention is characterized by including a step of irradiating an exposure beam to an exposure object arranged to face a first surface of a mask from the second surface side of the mask and exposing a mask pattern formed on the mask to the exposure object, wherein the mask pattern is a pattern corrected by using an inverse function of a predetermined transfer function; the transfer function is a function for converting first data to second position data; the first position data indicates positions of a plurality of marks when supporting a transfer function determining thin film having the marks in a state where the first surface thereof directs upward; and the second position data indicates positions of the marks when supporting the transfer function determining thin film in a state where the second surface thereof directs upward.

The mask may be either of a stencil mask having holes as exposure beam transmission portions or a membrane mask formed with an exposure beam block film on a part of the exposure beam transmission film. Also, the transfer function determining thin film can be used for exposure by forming thereon exposure beam transmission portions in a different mask pattern from that of the mask.

Consequently, it becomes possible to prevent a position of a pattern from deviating by the mask deformation due to gravity. Accordingly, a fine pattern can be formed with high accuracy and a semiconductor device can be furthermore highly integrated. Also, lithography tolerance increases and the yield of semiconductor device improves.

To attain the above object, a mask production method of the present invention is characterized by including a step of creating first position data indicating positions of a plurality of marks when supporting a first thin film having the plurality of marks in a state where a first surface thereof directs upward; a step of creating second position data indicating positions of the marks when supporting the first thin film in a state where a second surface thereof directs upward; a step of obtaining a transfer function for converting the first position data to the second position data; a step of correcting a mask pattern as a shape of exposure beam transmission portions to be formed on a second thin film by using an inverse function of the transfer function; and a step of producing a mask including a second thin film having exposure beam transmission portions in a corrected mask pattern.

Alternately, a mask production method of the present invention is characterized by including a step of creating first position data indicating positions of a plurality of marks when supporting a first thin film having the marks and exposure beam transmission portions in a predetermined pattern in a state where a first surface thereof directs upward; a step of producing a first mask having the first thin film and a thin film supporting portion formed on a second surface side of the first thin film; a step of creating second position data indicating positions of the marks when supporting the first thin film in a state where the second surface thereof directs upward; a step of obtaining a first transfer function for converting the first position data to the second position data; a step of performing exposure for producing a device by supporting the first thin film in a state where the second surface thereof directs upward and irradiating an exposure beam from the second surface side to a first mask; a step of correcting a mask pattern as a shape of exposure beam transmission portions to be formed on a second thin film by using an inverse function of the first transfer function; and a step of producing a second mask including the second thin film having a plurality of marks and exposure beam transmission portions in a corrected mask pattern.

Consequently, it becomes possible to prevent a position of a pattern from deviating by the mask deformation due to gravity. According to the mask production method of the present invention, since correction can be made at pattern drawing by using the transfer function even for a mask with a different pattern, an increase of mask production steps can be prevented. Also, since the effect of the mask deformation due to gravity can be eliminated when producing a mask, tolerance of a mask production process increases and the yield of a mask improves.

To attain the above object, a mask of the present invention is characterized by having a thin film formed with exposure beam transmission portions in a predetermined pattern, for exposing an exposure beam from a second surface side to an exposure object arranged to face to a first surface of the thin film, wherein the pattern is a pattern corrected by using an inverse function of a predetermined transfer function; the transfer function is a function for converting first position data to second position data; the first position data indicates positions of a plurality of marks when supporting a transfer function determining thin film having the marks in a state where the first surface thereof directs upward; and the second position data indicates positions of the marks when supporting the transfer function determining thin film in a state where the second surface thereof directs upward.

Consequently, it becomes possible to prevent a position of a pattern from deviating by the mask deformation due to gravity. By performing exposure by using the mask of the present invention, a fine pattern can be formed with high accuracy.

BRIEF DESCRIPTION OF DRAWINGS

FIG. 17 are views showing a simulation result of the mask deformation in the mask production method according to the embodiment 6 of the present invention, wherein

FIG. 21 is a plan view showing an example of the semiconductor device formed by the production method of the semiconductor device according to embodiment 8 of the present invention.

BEST MODE FOR CARRYING OUT THE INVENTION

Figure 1A:
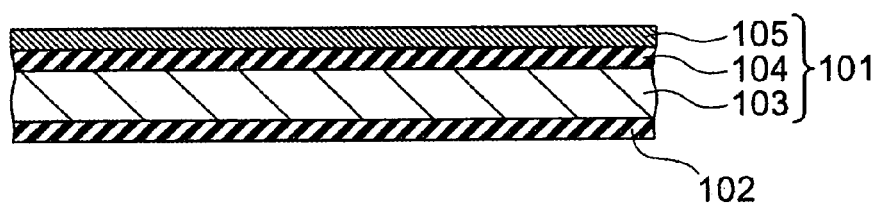
FIG. 1A to 1F are views showing an example of producing steps of a stencil mask.
Figure 1B:
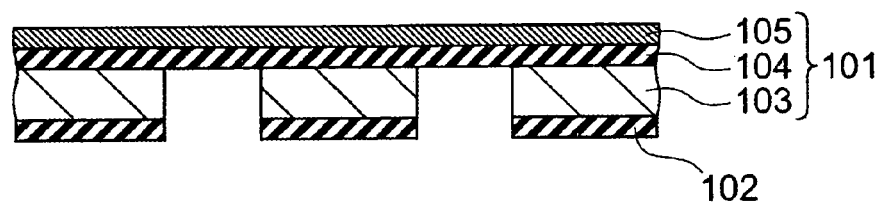

Below, embodiments of a mask pattern correction method, a production method of a semiconductor device, a mask production method and a mask of the present invention will be explained with reference to the drawings. A mask of the present invention is assumed to be a mask produced by a mask pattern correction method and a mask production method of the present invention. According to the mask pattern production method of embodiments of the present invention, a mask pattern is drawn to correct deformation of the mask due to gravity.

As a mask pattern correction method, a change of a pattern position by deformation due to gravity in a posture at mask pattern drawing (a state where a pattern surface faces upward) and a posture at exposure (a state where a pattern surface faces downward) is obtained as a position transfer function (hereinafter, referred to as a transfer function) F. Mask design data is converted by an inversion function $F^{-1}$ of the transfer function F, so that a mask pattern is arranged at a position as set by the design data in a posture at exposure. A position of drawing the mask pattern (electron beam drawing data) is determined as the next formula (1).

$$\text{Electron Beam Drawing Data} = F^{-1}(\text{Design Data}) \quad (1)$$

The transfer function F is generally not an analytic function but a generalized function defined by a large number of sampling points. When sampling points in a posture at mask pattern drawing are $\{r_j\}$ (j=1, 2, ..., n) and points corresponding to the respective sampling points $\{r_j\}$ in the posture at exposure are $\{R_j\}$ (j=1, 2, ..., n), the transfer function F is defined by the next formula (2). Here, $\{r_j\}$ is assumed to be a vector $r_j$ and $\{R_j\}$ is assumed to be a vector $R_j$. Also, "n" is the number of the sampling points.

$$\begin{Bmatrix} \vec{R}_1 \\ \vec{R}_2 \\ \vdots \end{Bmatrix} \{F\} \begin{Bmatrix} \vec{r}_1 \\ \vec{r}_2 \\ \vdots \end{Bmatrix} \quad (2)$$

Coordinates of the respective sampling points $\{r_j\}$ are defined as the next formula (3).

$$\{r_j\} = (x_j, y_j)(j=1, 2, \ldots, n) \quad (3)$$

Also, coordinates of the points $\{R_j\}$ corresponding to the respective sampling points $\{r_j\}$ are defined as the next formula (4).

$$\{R_j\} = (X_j, Y_j)(j=1, 2, \ldots, n) \quad (4)$$

Also, the $\{R_j\}$ may not be positions of points on the mask in the posture at exposure and may be positions where the respective sampling points $\{r_j\}$ are actually transferred to a resist when performing exposure on the resist on a wafer by using the mask. In this case, the transfer function F includes an effect of exposure position accuracy.

Alternately, it is also possible to perform etching on the wafer by using the resist on the wafer and positions of the etching portions on the wafer may be $\{R_j\}$. In this case, the transfer function F includes an effect of exposure position accuracy and an effect of etching position accuracy.

Below, an algorithm for obtaining a suitable drawing position from a pattern position of design data will be explained. A design position of a certain pattern is assumed to be $\{R\}=(X, Y)$. A position $\{r\}$ for the pattern to be actually transferred at the position $\{R\}$ on the mask is obtained by the processing below.

Coordinates of the $\{r\}$ are approximated as they can be expressed by one analytic function of coordinates of $\{R\}$ in a region near $\{r\}$. Particularly when they are approximated, as they can be expressed as a polynomial of the coordinates of $\{R\}$, numeric calculation becomes easy. Namely, it is expressed by the next formula (5).

$$x = \sum_{i=0}^{M} \sum_{j=0}^{M-i} a_{ij} X^i Y^j \quad (5)$$

$$y = \sum_{i=0}^{M} \sum_{j=0}^{M-i} b_{ij} X^i Y^j$$

Here, M is a maximum order of an approximating multinomial and can be freely set in accordance with required accuracy. Points $\{r_1\}$, $\{r_m\}$, ... near $\{r\}$ are taken out and subjected to fitting processing by using the minimum squares method by coordinates of corresponding $\{R_1\}$, $\{R_m\}$, ... As a result, coefficients $a_{ij}$ and $b_{ij}$ are determined. Here, the explanation was made by approximation by a multinomial, but it is not necessarily a multinomial and approximation by another function, such as spline approximation, is also possible.

Figure 3:
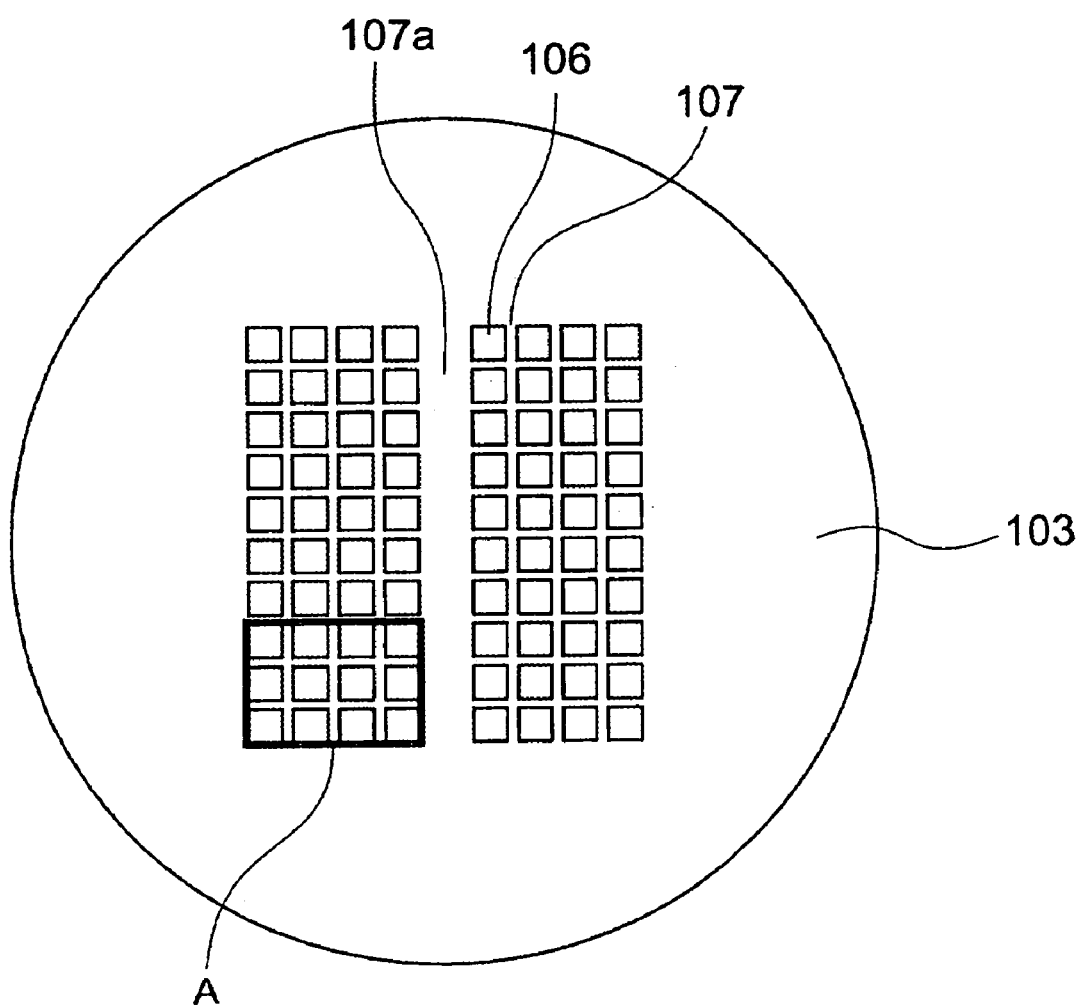
FIG. 3 is a plan view showing an example of a stencil mask.
Figure 4:
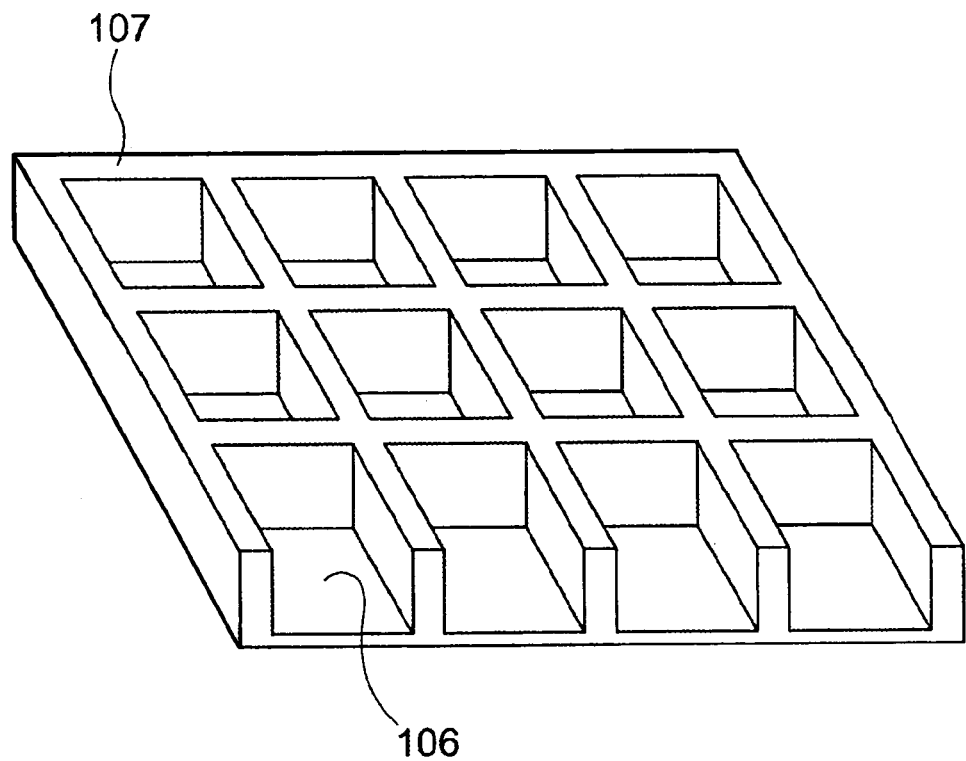
FIG. 4 is a perspective view of a part of FIG. 3.

Alternately, since a mask is generally divided to small area membranes by beams as shown in FIG. 3, as described in the article on SCALPEL (L. E. Ocola et al., J. Vac. Sci. Technol. B 19,2659 (2001)), particularly in formulas (1) to (4), there is also a method of bringing together results of transfer function measurement as correction data of respective membrane deformation.

In this case, changes of coordinates by deformation due to gravity in a membrane are expressed by the next formula (6) by a translational operation T and a transformation matrix M including rotation, orthogonality and enlargement.

$$R = T + M \times r \qquad (6)$$

The conversion can be determined by measuring positional change of coordinate measurement marks in a focused membrane. When conversion of the formula (6) is determined, a suitable drawing position can be determined by inverse conversion thereof.

The above method is an idealistic algorithm. However, when correcting respective coordinate values by exactly following the above, a large number of oblique lines nearly in parallel with the X-axis and Y-axis arise. When there are many oblique lines in a pattern, it becomes disadvantageous in terms of a processing time and accuracy, etc. in mask data processing and drawing. Since a positional transfer function is generally a gentle function, the disadvantages can be prevented without deteriorating correction accuracy by approximating to lines in parallel with the X-axis or Y-axis under a certain condition.

Below, a method of obtaining the transfer function F will be explained in detail.

[Embodiment 1]

According to the present embodiment, a transfer function determining mask is produced and mark positions are measured by the transfer function determining mask to obtain a transfer function F. The transfer function determining mask is a mask having the same mask configuration as that of an actual device production mask and formed with coordinate measuring instrument marks instead of a mask pattern. By using the transfer function F obtained by the transfer function determining mask, a mask pattern of an actual device production mask is corrected. A device production mask is produced by the corrected mask pattern.

Figure 8A:
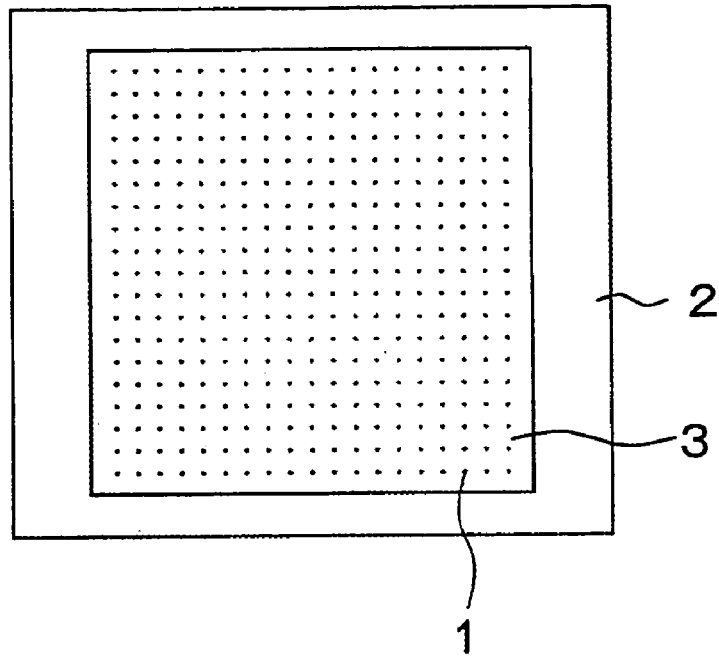
FIG. 8A shows an example of arranging marks on a mask in the mask production method according to embodiment 1 of the present invention.
Figure 8B:
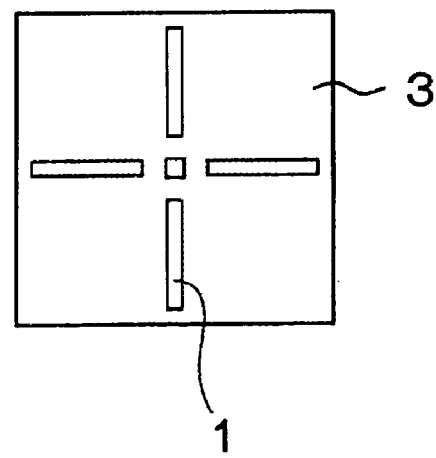
FIG. 8B is an enlarged view of the mark.

FIG. 8A shows an example of a typical mark arrangement on the transfer function determining mask. As shown in FIG. 8A, a plurality of coordinate measuring instrument marks 1 are arranged regularly, for example in a lattice, on a membrane 3 surrounded by beams 2 on the mask. The coordinate measuring instrument marks 1 are detected by a coordinate measuring instrument using a laser beam. FIG. 8B is an enlarged plan view of one of the marks 1 in FIG. 8A. As shown in FIG. 8B, the mark 1 has a shape arranged with a plurality of rectangles, for example, in a cross shape or a square shape, etc. The shape of the mark 1 is not particularly limited as long as the mark can be easily formed.

In the present embodiment, an example of a stencil mask will be explained. A stencil mask can be produced by the method explained above (refer to FIG. 1A to FIG. 1F) or another method. When producing a mask by the above explained method, the coordinate measuring instrument marks can be formed by a step of forming holes on a membrane after forming beams (refer to FIG. 1E and FIG. 1F).

Figure 1C:
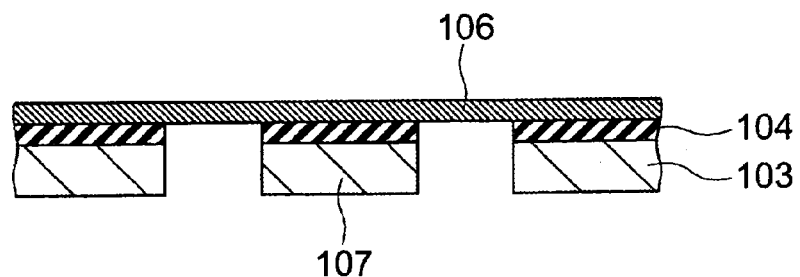
Figure 1D:
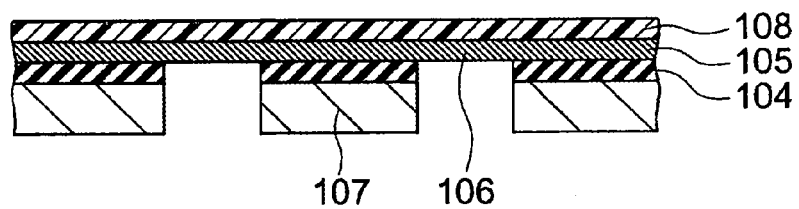
Figure 1E:
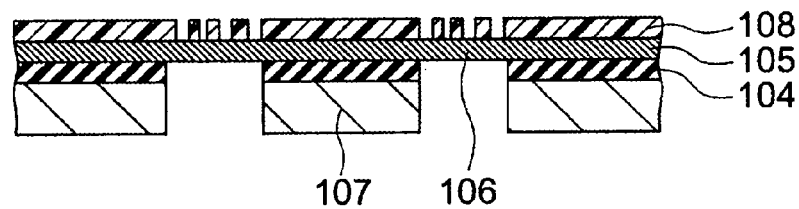
Figure 1F:
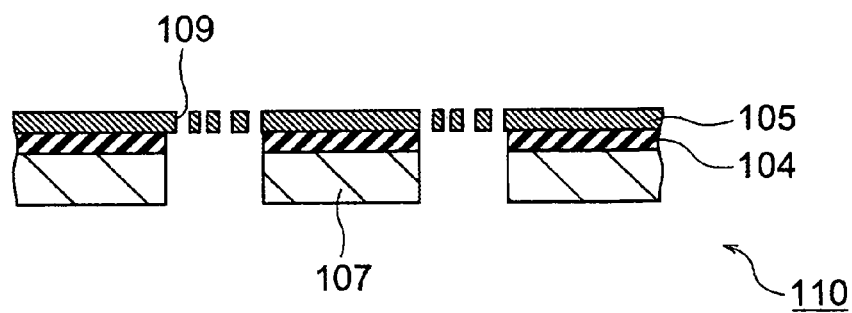
Figure 2A:
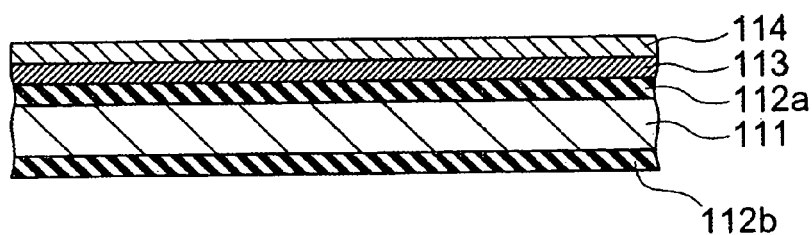
FIG. 2A to FIG. 2F are views showing an example of producing steps of a membrane mask.
Figure 2B:
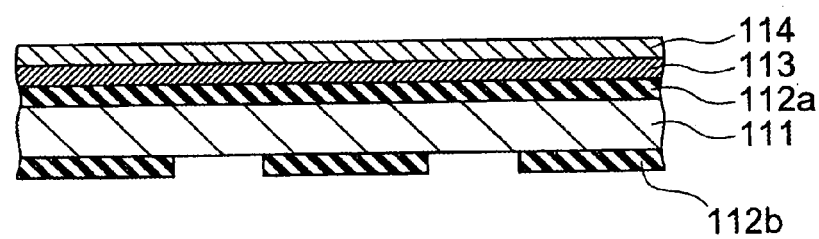
Figure 2C:
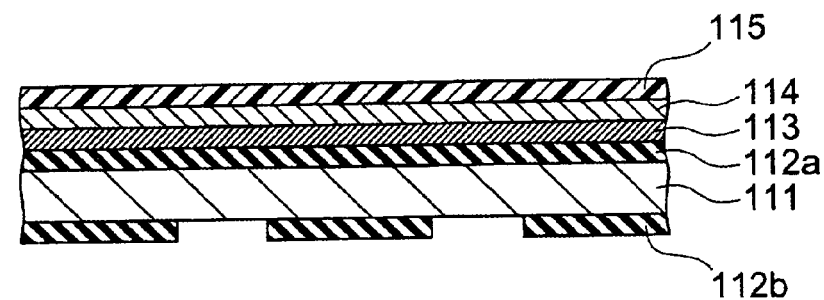
Figure 2D:
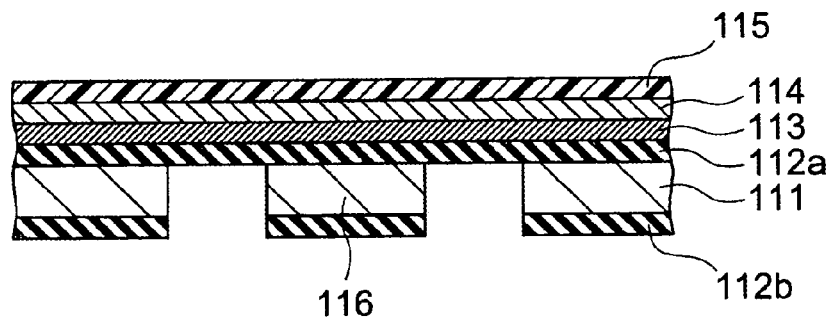
Figure 2E:
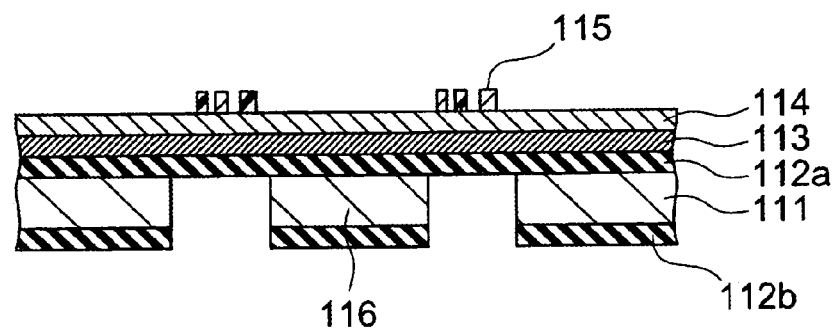
Figure 2F:
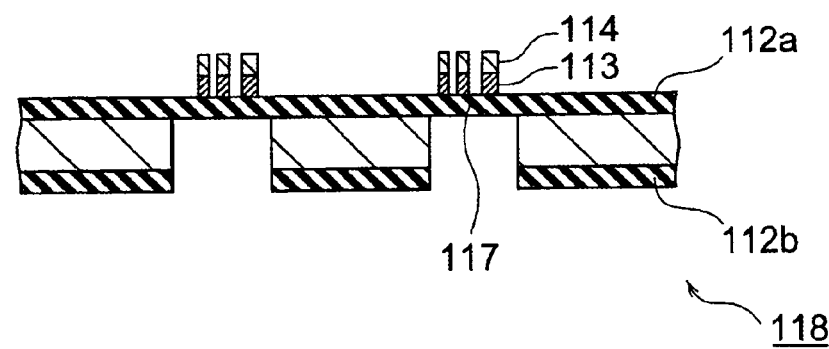
Figure 9:
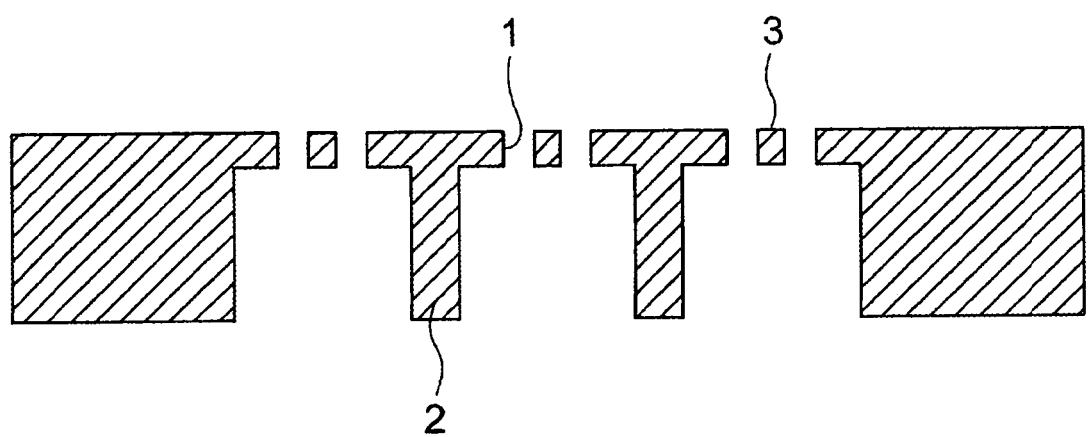
FIG. 9 is a sectional view of a transfer function determining mask in the mask production method according to embodiment 1 of the present invention.

Steps up to the step shown in FIG. 1C are at a low difficulty level and a stabilized process. Also, the coordinate measuring instrument marks have a larger size comparing with a device pattern and are formed by a cross shape or a square shape, etc. of 10 μm or so. Accordingly, processing of the coordinate measuring instrument marks is easy and positional accuracy can be heightened. FIG. 9 is a sectional view showing a part of a membrane of a transfer function determining mask. As shown in FIG. 9, coordinate measuring instrument marks 1 are formed on a membrane 3 divided by beams 2.

In a method of producing an X-ray mask described in the Japanese Unexamined Patent Publication No. 8-203817 explained above, positional deviation in a minute region caused by a stress difference of the membrane and an X-ray absorbance is corrected. Such positional deviation depends on a mask pattern, so that, for accurate correction, two masks have to be produced for each mask pattern: for measuring positional deviation and for producing a device (for exposure).

Figure 5:
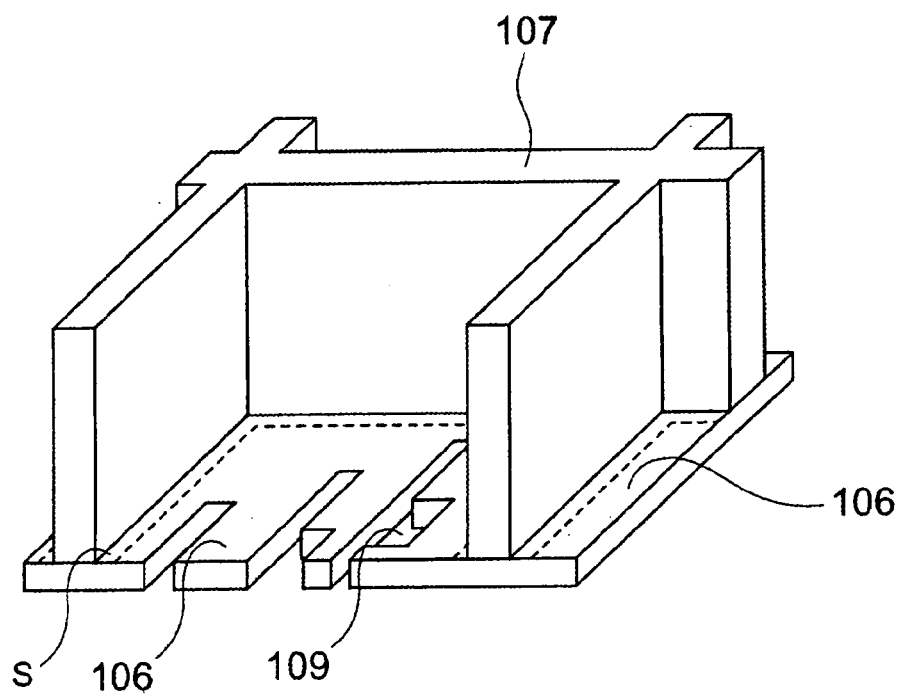
FIG. 5 is an enlarged perspective view of the membrane in FIG. 3 and FIG. 4.

On the other hand, deformation of a mask due to gravity is known to be expressed by a continuous gentle function (for example, refer to "Theory of Plates and Shells" S. P. Timoshenko and S. Woilwsky-Krieger). An amount of the deformation does not strongly depend on a minute structure (mask pattern) of the mask as shown in FIG. 5 and has high reproducibility.

Accordingly, once accurate measurement is performed and a database corresponding to the formula (2) is created, positional correction can be made by using the database continuously in producing a mask with a different mask pattern.

According to the present embodiment, it is not necessary to produce two masks for coordinate measurement and for exposure for each mask pattern, so that a time and cost for producing a mask can be reduced. Note that the mask configuration other than the mask pattern, such as a membrane thickness and an arrangement of beams, are assumed to be the same. Also, a holding method of the masks is assumed to be the same.

As explained above, after producing a transfer function determining mask, positions of coordinate measuring instrument marks are measured in a posture at mask pattern drawing (a state where the pattern surface directs upward). A coordinate measuring instrument of, for example, IPRO (made by LEICA) and Lightwave 6I (made by Nikon) can be used for the measurement.

At this time, the mask is preferably held by the same method as that of an electron beam drawing machine as much as possible. For example, when a mask holding means of an electron beam drawing machine is an electrostatic chuck, it is preferable that the mask is held by a similar electrostatic chuck by a coordinate measuring instrument. When it is impossible, since an electronic beam drawing machine normally has a mark detection function by a scanning electron microscope (SEM), mark detection may be performed by using the same. When using the mark detection function of the electronic beam drawing machine, measurement of mark positions and drawing of a mask pattern can be performed under a condition where an effect of gravity is completely the same. The case of using the mark detection function of the electron beam drawing machine will be explained later in embodiment 2.

After detecting positions of the coordinate measuring instrument marks by the coordinate measuring instrument, the mask is attached to an exposure apparatus so that the pattern surface directs downward. A resist is applied to a wafer in advance and the coordinate measuring instrument marks are transferred to the resist on the wafer by performing exposure and development. After that, mark positions transferred to the resist on the wafer are measured. A transfer function F can be obtained from data of the mark positions measured by the coordinate measuring instrument and mark positions on the wafer.

Figure 10:
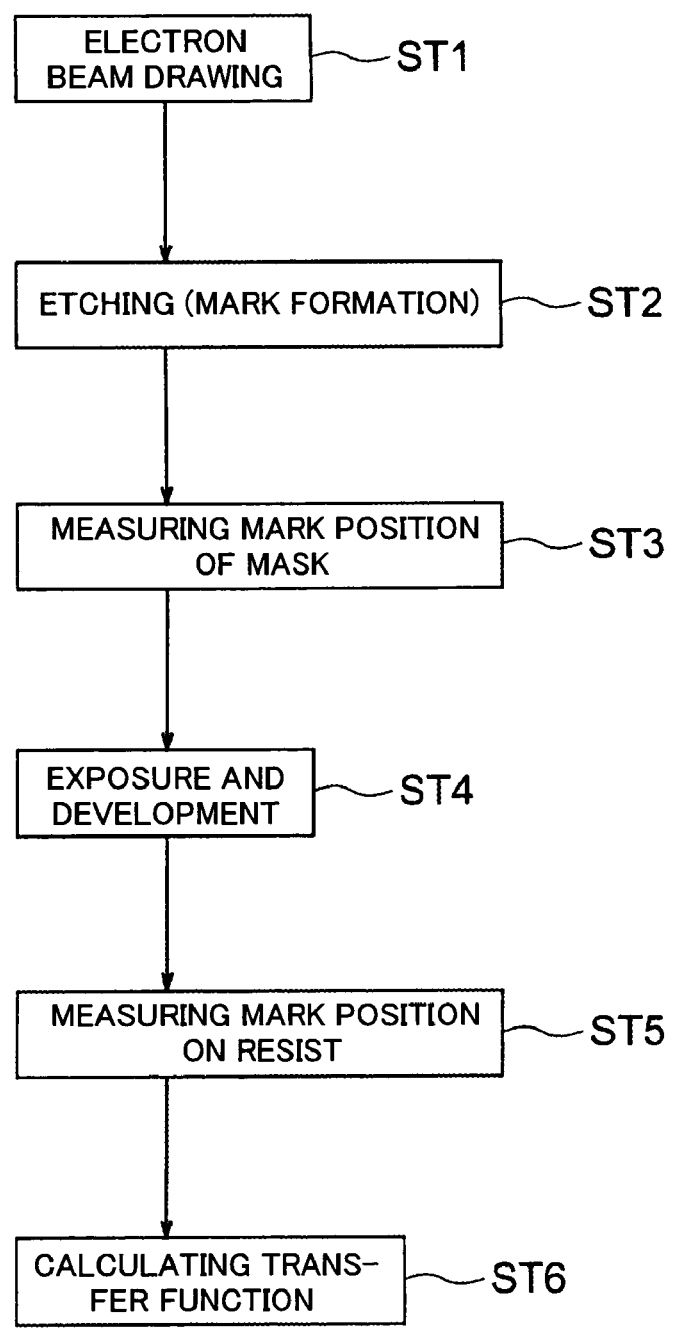
FIG. 10 shows a flow of the mask production method according to embodiment 1 of the present invention.
Figure 11A:
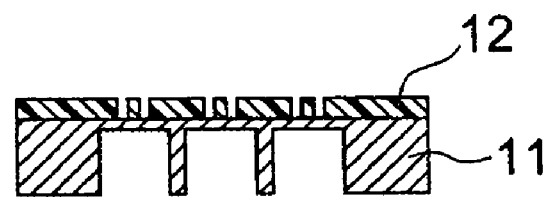
FIG. 11A to FIG. 11D are sectional views of a mask in respective steps in FIG. 10.

A flow of the present embodiment is summarized in FIG. 10. In a step 1 (ST1), as shown in FIG. 11A, electron beam drawing is performed on a resist 12 on a mask 11.

Figure 11B:
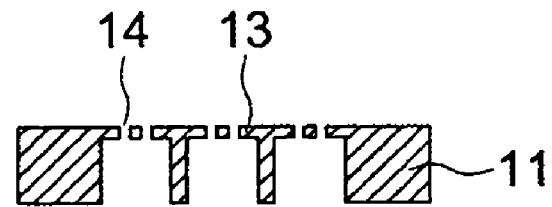

In a step 2 (ST2), as shown in FIG. 11B, etching is performed on a membrane 13 to form coordinate measuring instrument marks 14.

In a step 3 (ST3), mark positions are measured by using the coordinate measuring instrument. In the same way as in FIG. 11B, a pattern surface of the mask is made to face upward.

Figure 11C:
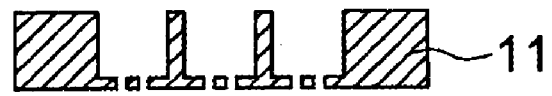

In a step 4 (ST4), as shown in FIG. 11C, exposure and development are performed on the resist on the wafer in a state where the pattern surface of the mask 11 directs downward.

Figure 11D:

In a step 5 (ST5), as shown in FIG. 11D, positions of marks 17 transferred to the resist 16 on the wafer 15 are measured.

In a step 6 (ST6), a transfer function is obtained from mark positions of the mask and mark positions on the wafer.

Note that correction of the mask pattern by the transfer function may be performed before inputting design data to the electron beam drawing machine or after inputting to the electron beam drawing machine. Generally, design data is corrected, converted to a format of the electron beam drawing machine, and input to the electron beam drawing machine. Here, the design data is corrected by an inverse function of the transfer function, and the correction data is converted to a format of the electron beam drawing machine and input to the electron beam drawing machine. Alternately, correction by the transfer function may be performed at a stage of converting the design data to a format of the electron beam drawing machine. In this case, the design data subjected to the positional correction is input as electron beam drawing data to the electron beam drawing machine.

When performing positional correction after inputting the design data to the electron beam drawing machine, a memory of the electronic beam drawing machine is used. The memory of the electronic beam drawing machine has a relatively simple graphic calculation function, and an output of data conversion by using the inverse function of the transfer function can be obtained as it is.

[Embodiment 2]

In the present embodiment, a mark position measuring method with the pattern surface of the mask facing upward is different from that of embodiment 1. According to the present embodiment, mark positions on the mask are measured by using a mark detection function of the electronic beam drawing machine.

When measuring mark positions by the SEM of the electronic beam drawing machine, mark positions are measured after electronic beam drawing and development of marks on the resist on the mask surface by the electron beam drawing machine. After that, etching is performed on the membrane by using the resist as a mask to form marks.

Deformation on an x-y plane due to flexure of the membrane due to gravity is an order of 1 to 100 nm, and to measure it accurately, it is necessary to use a very expensive coordinate measuring instrument with measurement accuracy of, for example, 2 nm or so (LEICA LMS IPRO, etc.). Measurement accuracy of a mark detection function by the SEM of the electron beam drawing machine is an order of 10 to 100 nm, which is low comparing with that of the coordinate measuring instrument, but substantially sufficient measurement accuracy can be obtained by the operation below.

When using the mark detection function of the electron beam drawing machine, mask deformation in the case with the pattern surface facing upward and the case of facing downward is obtained not from the x-y coordinates of the marks but from height positions (z-coordinate). For example, warps of a stencil mask can be measured by a noncontact shape measuring instrument using a laser autofocusing function (for example, YP20/21 made by Sony Precision technology Inc., etc.). A curve w (x, y) of warps of the mask can be obtained from the data. When warps of the mask are obtained, displacement on the x-y plane can be obtained from the next formula (7). Here, "u" and "v" indicate displacements in the x and y directions, and "h" indicates a membrane thickness.

$$u = -\frac{h}{2}\frac{\partial w}{\partial x}$$
$$v = -\frac{h}{2}\frac{\partial w}{\partial y}$$
(7)

Also, instead of obtaining the z-coordinate of the coordinate measuring instrument marks by a noncontact shape measuring instrument as explained above, the curvature of flexture of the mask may be obtained by a height measuring instrument using a laser beam or a capacitance sensor. Displacement of each point on the mask can be obtained from the curvature data and the membrane thickness.

While mark positions after etching the membrane are measured in the embodiment 1, mark positions (mark positions on the resist on the mask) before etching the membrane are measured in the present embodiment. Accordingly, a finally obtained transfer function includes an effect of mark positional change due to etching processing on the membrane.

After performing etching on the membrane of the mask and forming marks, the mask is attached to the exposure apparatus with the pattern surface facing downward. On the other hand, a resist is applied to a wafer in advance, and exposure and development are performed. After that, positions of marks transferred to the resist on the wafer are measured. As a result, a transfer function F is obtained from data of the mark positions measured by the mark detection function of the electron beam drawing machine and mark positions on the wafer.

Figure 12:
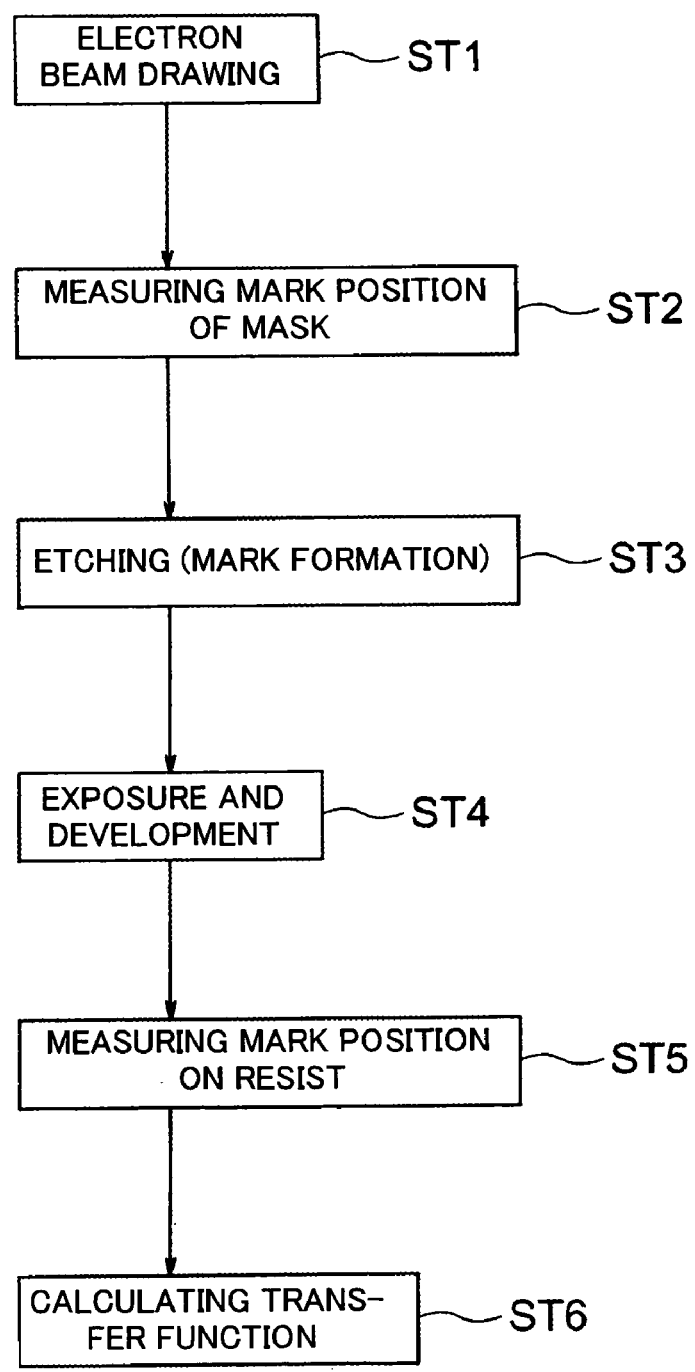
FIG. 12 shows a flow of the mask production method according to embodiment 2 of the present invention.
Figure 13A:
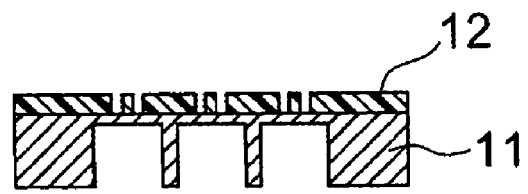
FIG. 13A to FIG. 13D show sectional views of a mask in respective steps in FIG. 12.

A flow of the present embodiment is summarized in FIG. 12. In a step 1 (ST1), as shown in FIG. 13A, electron beam drawing is performed on a resist 12 on a mask 11.

In a step 2 (ST2), an electron beam drawing machine is used for measuring mark positions on the resist on the mask. The mask positions are the same as those in electronic beam drawing in FIG. 13A.

Figure 13B:
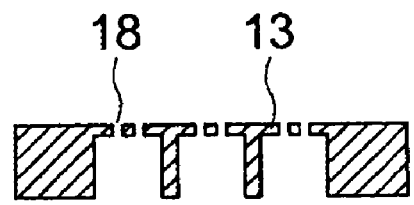

In a step 3 (ST3), as shown in FIG. 13B, etching is performed on a membrane 13 to form marks 18.

Figure 13C:
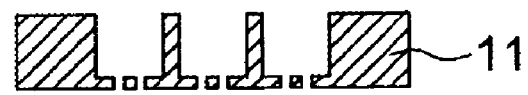

In a step 4 (ST4), as shown in FIG. 13C, exposure and development are performed on the resist on the wafer in a state where the pattern surface of the mask 11 directs downward.

Figure 13D:
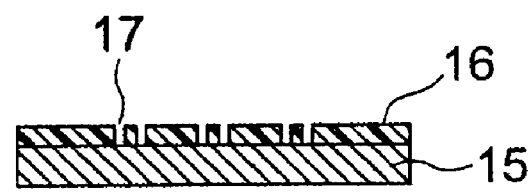

In a step 5 (ST5), as shown in FIG. 13D, positions of the marks 17 transferred to the resist 16 on the wafer 15 are measured.

In a step 6 (ST6), a transfer function is obtained from the mark positions on the mask and the mark positions on the wafer.

[Embodiment 3]

In the present embodiment, a mark position measuring method in a state where the pattern surface of the mask directs downward is different from that in the embodiment 1. According to the present embodiment, after transferring marks on the resist on the wafer by an exposure apparatus, etching is performed on the wafer by using the resist as a mask to form marks on the wafer surface, then, the resist is removed.

While mark positions (mark positions on the resist) before etching the wafer surface are measured in the embodiment 1, mark positions after etching the wafer surface are measured in the present embodiment. Accordingly, a finally obtained transfer function F includes an effect of mark position change by etching processing on the wafer.

Figure 14:
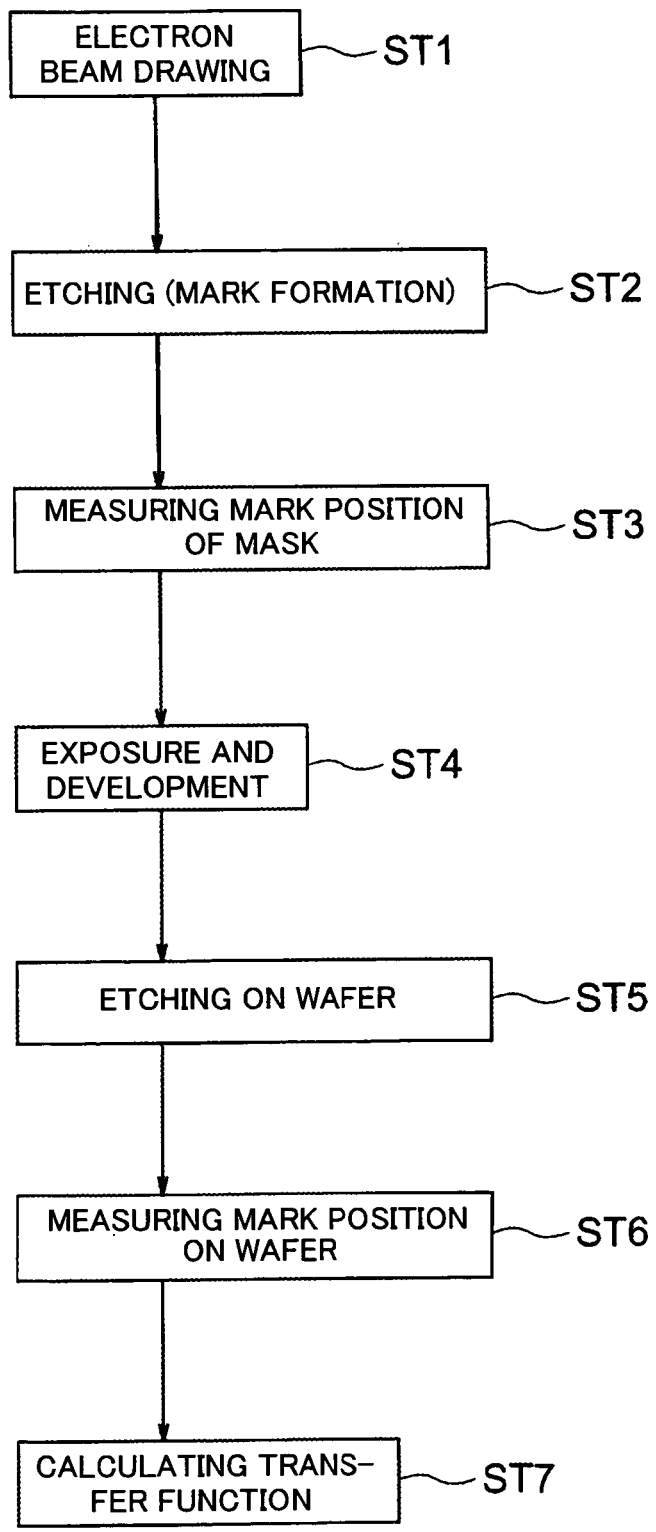
FIG. 14 shows a flow of the mask production method according to embodiment 3 of the present invention.
Figure 15A:
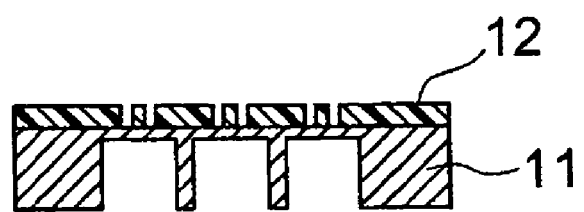
FIG. 15A to FIG. 15D are sectional views of a mask in respective steps in FIG. 14.

A flow of the present embodiment is summarized in FIG. 14. In a step 1 (ST1), as shown in FIG. 15A, electronic beam drawing is performed on a resist 12 on a mask 11.

Figure 15B:
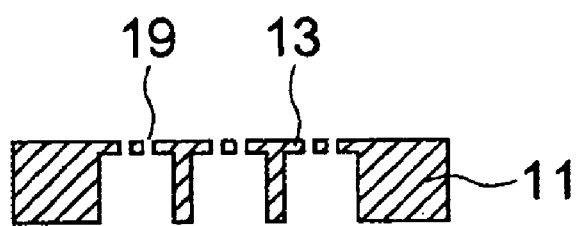

In a step 2 (ST2), as shown in FIG. 15B, etching is performed on a membrane 13 to form coordinate measuring instrument marks 19.

In a step 3 (ST3), mark positions are measured by using a coordinate measuring instrument. In the same way as in FIG. 15B, the pattern surface of the mask 11 is made to face upward.

Figure 15C:
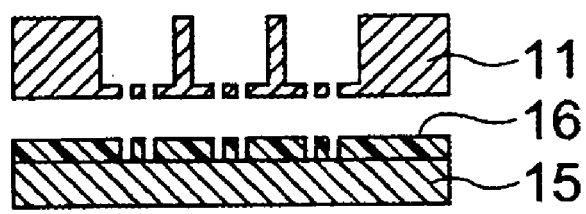

In a step 4 (ST4), as shown in FIG. 15C, exposure is performed on the resist 16 on the wafer 15 in a state where the pattern surface of the mask 11 directs downward, then, the resist 16 is developed.

Figure 15D:
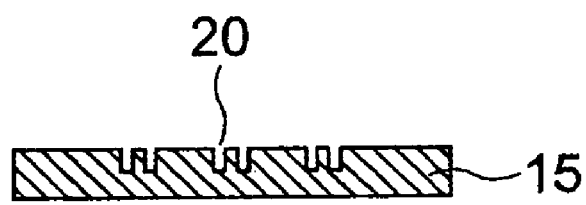

In a step 5 (ST5), as shown in FIG. 15D, etching is performed on the wafer 15 by using the resist 16 (refer to FIG. 15C) as a mask to form marks 20.

In a step 6 (ST6), positions of the marks 20 on the wafer are measured. In the same way as in FIG. 15D, the pattern surface of the mask is made to face upward.

In the step 7 (ST7), a transfer function is obtained from the mask positions on the mask and mark positions on the wafer.

In the above flow, the case of using a coordinate measuring instrument (the same as in the embodiment 1) was explained on measurement of mark positions with the pattern surface of the mask facing upward, but in the same way as in the embodiment 2, mark positions on the resist on the mask may be detected by using a mark detection function of the electron beam drawing machine.

[Embodiment 4]

According to the present embodiment, marks able to be detected from both of the upper and lower sides of the mask are processed on a membrane on the mask, and the mark positions are measured respectively in a state of inverting the mask. A transfer function F is obtained from the two data.

A mask holding method of measuring mark positions with the pattern surface of the mask facing upward is preferably the same as that in mask pattern drawing or a similar holding method as much as possible. Also, a mask holding method of measuring mark positions with the pattern surface facing downward is preferably the same as that in exposure or a similar holding method as much as possible. If necessary, a mask holder of an electron beam drawing machine or an exposure apparatus may be used.

[Embodiment 5]

According to the present embodiment, position detection marks are formed on portions other than membranes. Being different from the embodiment 4, it is sufficient if marks can be detected from one side of the mask. For example, as shown in a sectional view in FIG. 16, marks 21 and 22 are arranged on both sides of beam portions. Marks may be arranged on portions where beams or membranes are not formed. For example, a mark 23 is an example of a mark formed on a supporting frame portion.

In a state where the pattern surface directs upward, in the same way as in the embodiment 1, positions of front surface side marks 21 are measured by using a coordinate measuring instrument. In the same way as in the embodiment 2, electron beam drawing of marks may be performed on the resist applied to the membrane and detected by an SEM of the electron beam drawing machine. At this time, marks 21 are arranged on the mask surface side on portions formed with the beams 2.

Figure 16:
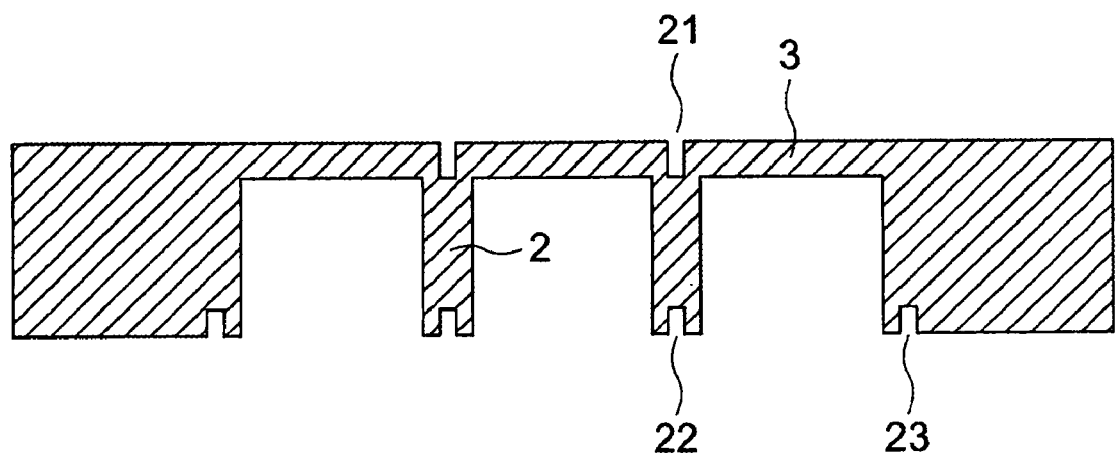
FIG. 16 is a sectional view of the transfer function determining mask in the mask production method according to embodiment 5 of the present invention.

In a state where the pattern surface directs downward, positions of back surface side marks 22 shown in FIG. 16 are measured. Deformation of the mask back surface due to gravity is obtained from displacement of the back surface side marks 22. A transfer function F is obtained from these two data. Deformation of a mask surface and deformation of a back surface directly affecting deformation of the pattern have the same absolute value and only signs are different (for example, refer to "Theory of Plates and Shells" S. P. Timoshenko and S. Woinowsky-Krieger). Namely, points on the front surface and back surface of the mask at the same x-y position in a state without flexture displace exactly by the same amount to opposite directions due to flexture. The displacement is proportional to a thickness of the membrane (refer to the formula (7)).

[Embodiment 6]

Not by actual position measurement but by using a numerical simulation, such as the finite element method (FEN), the boundary element method (BEM) and a finite difference method (FDM), or by using an analytic formula used in mechanics of materials approximately, deformation of a mask with the pattern surface directing upward and the pattern surface directing downward can be simulated to obtain a transfer function.

At this time, modeling of the mask is performed as accurate as possible and an upward and downward mask holding methods are faithfully modeled. Furthermore, by considering changes of an effective rigid matrix of the membrane due to pattern processing, a transfer function can be obtained more accurately.

Figure 17B:
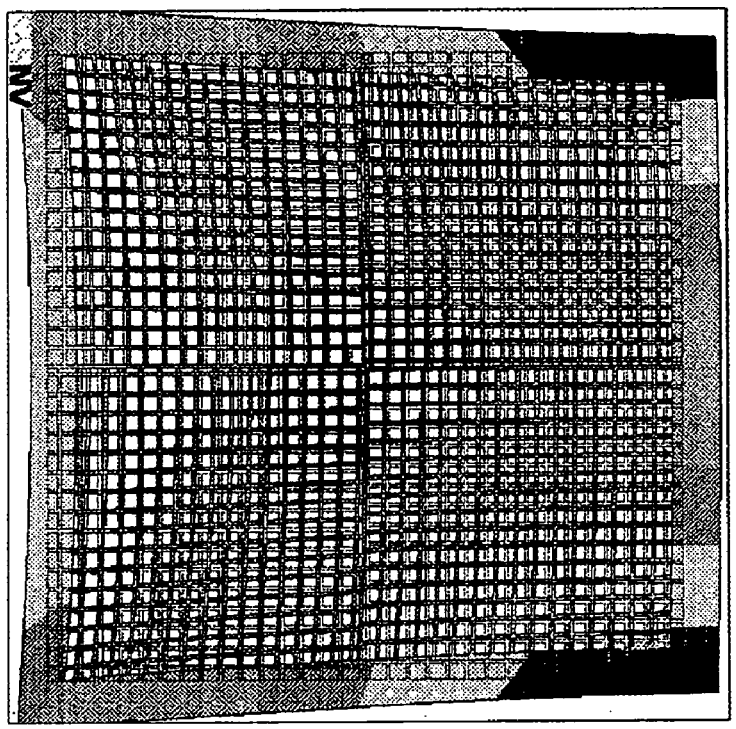
FIG. 17A shows flexure in the z-axis direction and FIG. 17B shows displacement on a z-y plane, respectively.
Figure 17A:
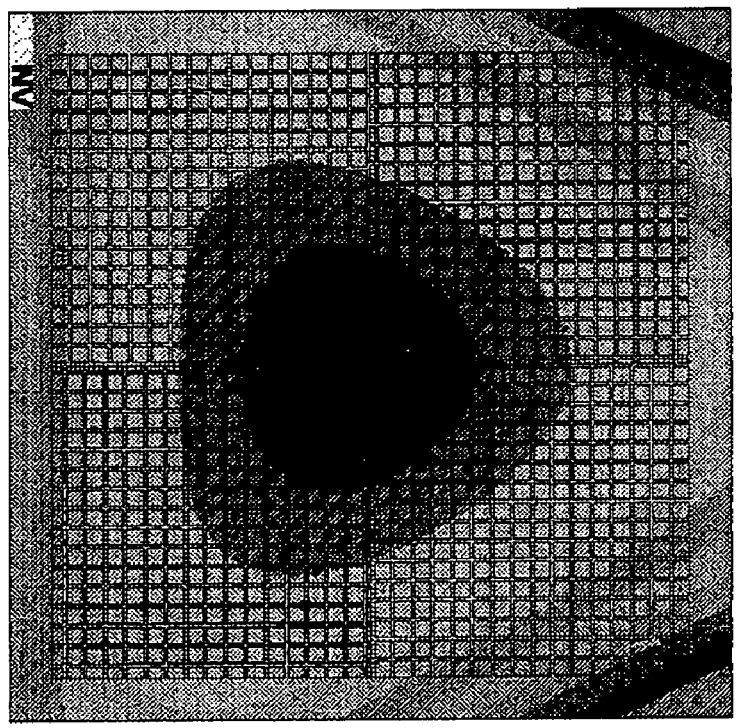

FIG. 17A and FIG. 17B show an example of a result of performing the FEM simulation on a LEEPL mask. It is assumed that the mask is formed by performing etching on an 8-inch SOI wafer. It is assumed that a silicon wafer of the SOI wafer (refer to FIG. 1A) has a thickness of 725 µm, a thickness of a buried oxide film is 500 nm and a thickness of a silicon layer is 500 nm. The silicon wafer and the buried oxide film are partially removed from the back surface side of the mask to form a membrane composed of a silicon layer. Also, the silicon wafer on non-removed portions is used as the beams (refer to FIG. 1C).

Figure 6A:
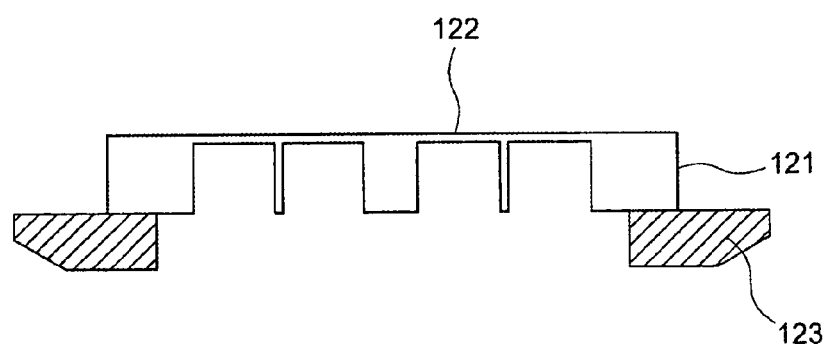
FIG. 6A is a view showing a mask when drawing a mask pattern.
Figure 6B:
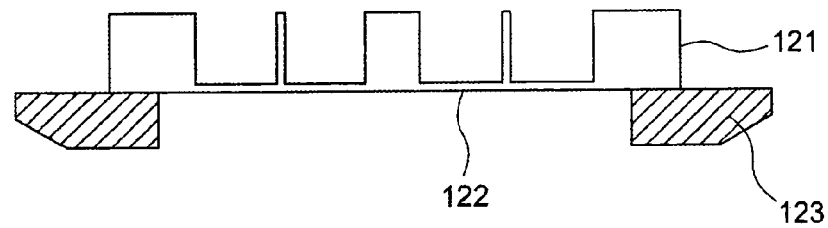
FIG. 6B is a view showing a mask under exposure.
Figure 7:
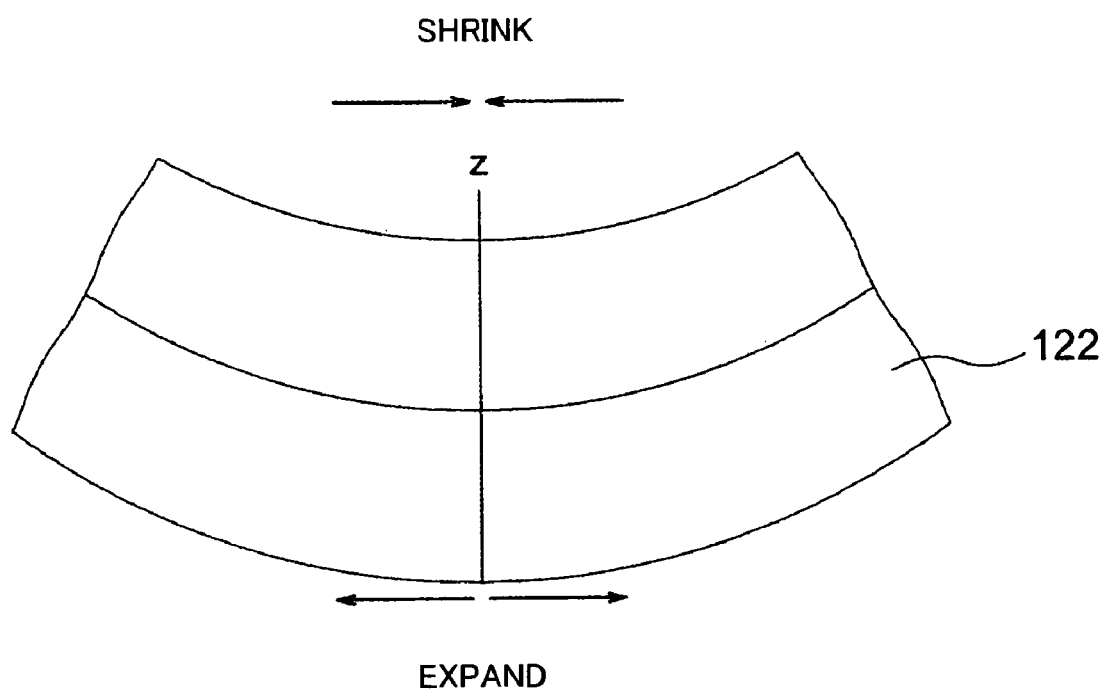
FIG. 7 is a view showing deformation of a membrane due to gravity.

FIG. 17A and FIG. 17B show simulations of a difference of deformation in a state of placing the mask with the membrane facing upward (refer to FIG. 6A) and a state with the membrane being hung and directing downward. In a state with the membrane facing downward, it was assumed to adhere the back surface side (the beam side) of the mask with three points from upward. When the membrane is an x-y plane and the direction perpendicular to the membrane is a z-axis direction, FIG. 17A shows a distribution of flexture in the z-axis direction and FIG. 17B shows displacement on the x-y plane.

As shown in FIG. 17A, the distribution becomes a circular shape on a part where flexture in the z-axis direction is the same degree and, still more accurately, an approximate triangle shape made by mask supporting portions as apexes. Flexture at the center is the maximum and the flexture reduces as being away from the center portion. As shown in FIG. 17B, displacement on the x-y plane is affected not only by a distance from the mask center portion but also by mask supporting positions.

As is known from FIG. 17A and FIG. 17B, flexture in the z-axis direction and displacement on the x-y plane do not have an abruptly changing part, and the mask deformation due to gravity is expressed by a gentle function.

A transfer function is obtained from the simulation result of displacement on the x-y plane, and deviation of a pattern position due to the mask deformation can be corrected.

Figure 18:
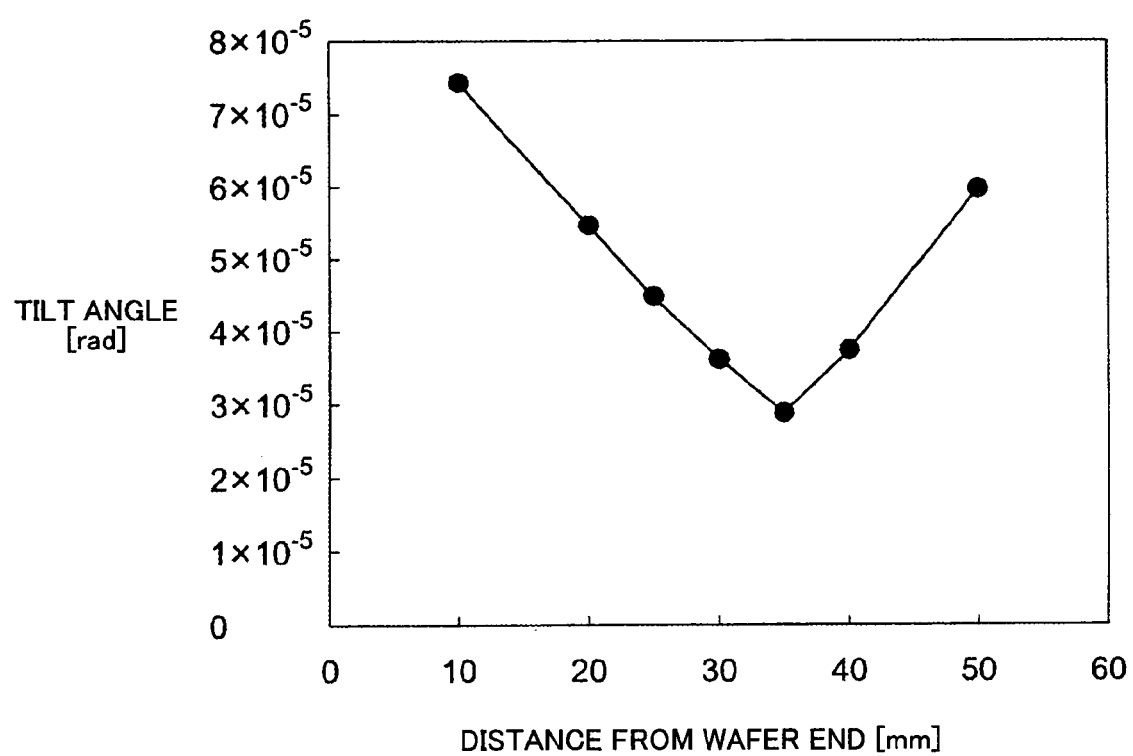
FIG. 18 is a graph showing a maximum inclined angle of the mask when changing the mask supporting position according to embodiment 6 of the present invention.

FIG. 18 is a graph showing a maximum tilt angle of the mask when changing mask supporting positions. A tilt angle of a vertical axis is an angle made by a tangent plane and a horizontal plane (a mask surface when without flexture) at a point on the mask. The horizontal axis is a distance from a wafer end (the outermost diameter of the mask). By multiplying the angle shown in FIG. 18 with half of the wafer thickness, the maximum displacement is obtained.

According to the above, it is known that even when a fixed position is deviated by some μm due to an error of the mask fixing, the mask deformation is hardly affected thereby. Namely, the mask deformation due to gravity has high reproducibility and, once accurate measurement is performed to obtain the transfer function, the transfer function can be said to be continuously used also when producing a mask after that as long as the supporting method is not widely changed.

Mark positions in a state where the pattern surface of the mask faces upward can be easily measured by using an existing coordinate measuring instrument and positional accuracy of the measurement is also high. Accordingly, it is also possible to actually measure the mark positions in a state where the pattern surface directs upward and to obtain deformation by a simulation for the state where the pattern surface directs downward. In this case, the measurement result in a state where the pattern surface directs upward may be used for optimizing the simulation, for example, for parameter adjusting and scaling, etc.

[Embodiment 7]

According to the present embodiment, not only coordinate measuring instrument marks but an actual mask pattern is processed on the membranes of a first mask. Mark positions are measured respectively in a state where the pattern surface directs upward and in the state of directing downward to obtain a transfer function. A mask wherein a mask pattern is corrected by the transfer function is not produced again and the first mask is used for exposure for producing an actual device.

After obtaining the transfer function by the first mask, a second mask having the same membranes, beams and structure, etc. but a different mask pattern from that of the first mask is produced. At this time, the transfer function obtained by the first mask is used for correcting the mask pattern of the second mask. The second mask is also used for exposure for producing an actual device.

The second mask is also formed with coordinate measuring instrument marks in the same way as in the first mask, and the mark positions are measured. A transfer function obtained by the second mask is used for correcting a mask pattern of a third mask not of the second mask. In this way, by not producing a mask again with the same mask pattern, using the respective masks for producing an actual device, and correcting a mask pattern of other mask successively by a positional transfer function obtained by each mask, an effect of deformation due to gravity can be suppressed in an asymptotic way.

Note that a mask holding method at measuring mark positions and at exposure is assumed to be the same for each mask. Also, marks are arranged on portions being independent of an operation of a device, such as scribe lines around a chip, etc. According to the present embodiment, the number of masks to be produced and mask producing steps are not increased because a transfer function is obtained by a mask for exposure.

[Embodiment 8]

Figure 19:
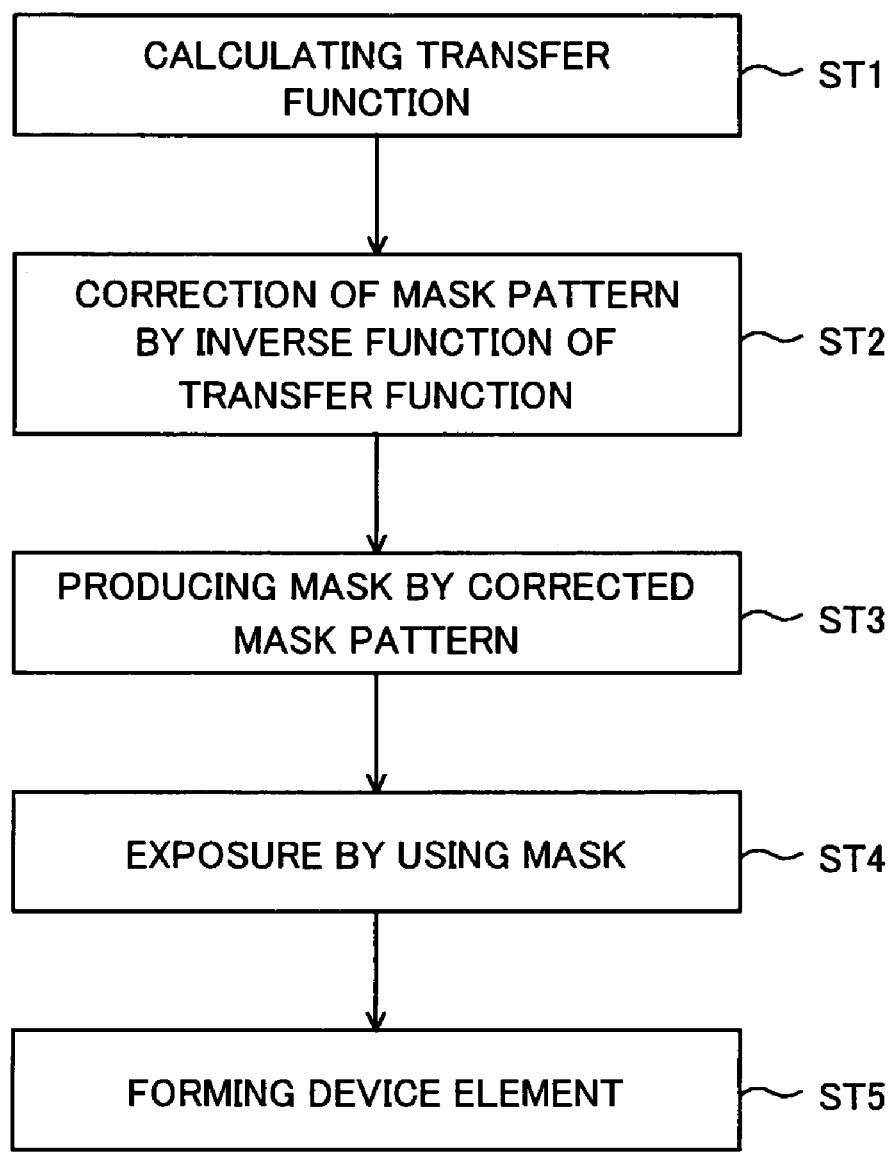
FIG. 19 shows a flow of the production method of the semiconductor device according to embodiment 8 of the present invention.

According to a production method of a semiconductor device of the present embodiment of the present invention, lithography is performed by using a mask wherein a mask pattern is corrected by following a method in the above embodiments. FIG. 19 shows a flow of a production method of a semiconductor apparatus of the present embodiment. In a step 1 (ST1), a transfer function is calculated. In step 2 (ST2), a mask pattern is corrected by an inverse function of the transfer function. Step 1 and step 2 may be performed by any one of methods in the embodiments 1 to 7.

In a step 3 (ST3), a mask is produced with a corrected mask pattern. In a step 4 (ST4), exposure is performed by using the produced mask. Specifically, a mask pattern is exposed on a resist applied to a wafer, then, the resist is developed and a resist pattern is formed.

In a step 5 (ST5), elements of a device are formed by using the resist pattern as a mask. As the elements of the device, for example, a gate layer and a contact, etc. are mentioned and a kind thereof is not limited as long as it is an element composing the device. For example, elements, such as a gate layer and a contact, can be formed by etching using the resist pattern as a mask. Also, by performing ion implantation by using the resist pattern as a mask, a well, a source/drain region and other elements can be also formed.

According to the above flow, a semiconductor device with high positional accuracy of a pattern can be produced. Accordingly, a pattern can be made finer and a semiconductor device can be made highly integrated. Also, due to the high positional accuracy of the pattern, the yield of the semiconductor device can be improved.

Figure 20:
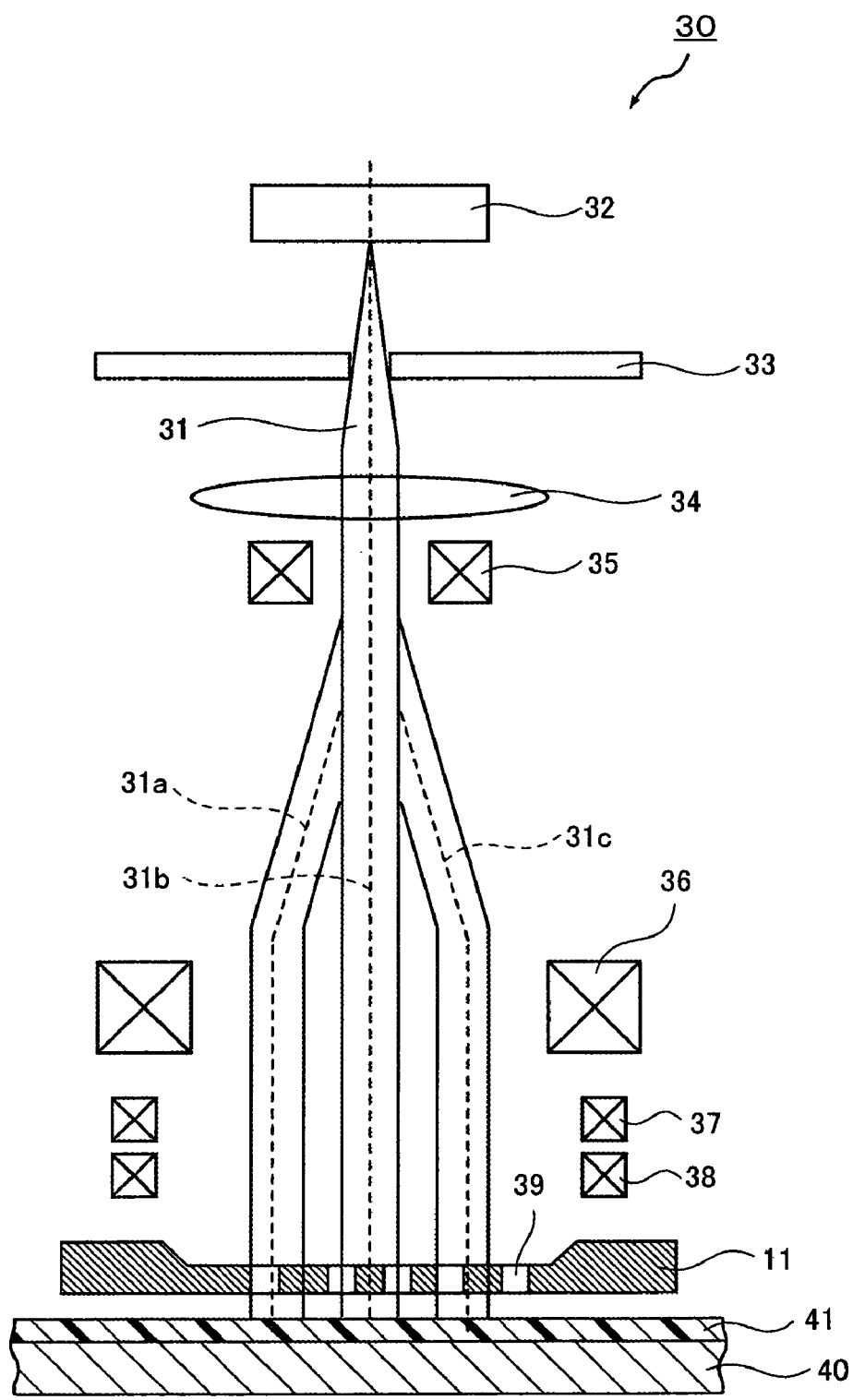
FIG. 20 is an example of an exposure apparatus used in the production method of a semiconductor device according to embodiment 8 of the present invention.

As an example of an exposure apparatus for electron beam lithography and X-ray lithography for forming a pattern on a device, a schematic view of a LEEPL exposure apparatus is shown in FIG. 20. The exposure apparatus 30 in FIG. 20 comprises an aperture 33, a condenser lens 34, a pair of main deflectors 35 and 36 and a pair of fine adjusting deflectors 37 and 38 other than an electron gun 32 for generating an electron beam 31.

The aperture 33 limits the electron beam 31. The condenser lens 34 makes the electron beams 31 a parallel beam. The main deflectors 35 and 36 and the fine adjusting deflectors 37 and 38 are deflection coils, and the main deflectors 35 and 36 deflect the electron beam 31, so that the electron beam 31 irradiates basically perpendicular to the surface of a stencil mask 11.

Electron beams 31a to 31c in FIG. 20 indicate a state that the electron beam 31, for scanning the stencil mask 11, is irradiated approximately vertical at each position on the stencil mask 11 and does not indicate that the electron beams 31a to 31c irradiate with respect to time on the stencil mask 11.

The fine adjusting deflectors 37 and 38 deflect the electron beam 31, so that the electron beam 31 irradiates perpendicular to or slightly tilted from perpendicular to the surface of the stencil mask 11. An incident angle of the electron beam 31 is optimized in accordance with a position of the hole 39, etc. formed to be a predetermined pattern on the stencil mask 11. The incident angle of the electron beam 31 is several mrad or so at maximum.

Energy of the electron beam for scanning the stencil mask 11 is several keV to tens of keV, for example, 2 keV. A pattern of the stencil mask 11 is transferred to the resist 41 on the wafer 40 by the electron beam passing through the hole 39. The stencil mask 11 is arranged to be immediately above the wafer 40, so that a distance of the stencil mask 11 and the wafer becomes tens of μm or so.

According to the LEEPL exposure apparatus having the above configuration, exposure of a fine pattern is possible. By using the mask with a mask pattern corrected by following the mask pattern correction method of the present invention for the above LEEPL exposure apparatus, positional deviation of a pattern by deformation due to gravity of the mask is eliminated. Accordingly, a fine pattern can be formed on a device with high accuracy.

A mask with a mask pattern corrected by following the mask pattern correction method of the present invention can be preferably used in the exposure apparatus shown in FIG. 20 and other exposure apparatus.

FIG. 21 is an example of a plan view showing a part of a semiconductor device to be produced by steps including exposure of a pattern by LEEPL as above. FIG. 21 is an example of a MOS transistor, wherein an active region 52 is formed on a chip 51 and an element isolation region 53 is formed around the active region 52. The active region 52 has predetermined conductivity, and the element isolation region 53 electrically insulates between the active region 52 and an adjacent active region (not shown).

Gate electrodes 54a to 54c composed of polycrystalline silicon or silicide, etc. are formed to be gate lengths of La to Lc, respectively. A method of producing a semiconductor device of the present invention is particularly effective for forming a fine pattern of the gate electrodes 54a to 54c, etc. having gate lengths of La to Lc as such.

According to the mask pattern correction method and a mask production method of the present embodiment of the present invention explained above, a mask having high positional accuracy of a pattern to be transferred can be produced by any charged particle beam exposure method of a reduced transfer type and a near unmagnified transfer type. Consequently, the yield of the lithography step is improved, which results in an improvement of the yield of the device.

According to the mask pattern correction method and mask production method of the present embodiment of the present invention, since pattern displacement due to inversion of the pattern surface at mask pattern drawing and at exposure can be accurately corrected, the degree of freedom in designing a mask holding means becomes high in an electron beam drawing machine and exposure apparatus.

Also, according to the mask production method of the present embodiment of the present invention, since the effect of the mask deformation due to gravity can be eliminated, the margin of the mask producing process becomes large and the yield of mask production is improved.

Embodiments of the mask pattern correction method, mask production method, production method of a mask and semiconductor device are not limited to the above explanation. For example, a mask of the present invention may be a membrane mask. Also, the exposure beam is not limited to the electron beam and may be an ion beam and other charged particle beam, an X-ray (wavelength: several Å), an extremely short ultraviolet ray (wavelength: about 10 to 20 nm or so) or an ultraviolet ray, etc. Furthermore, drawing of marks on the resist may be performed by a charged particle beam (for example, an ion beam) other than an electron beam, an X-ray, an extremely short ultraviolet ray or an ultraviolet ray. Other than that, a variety of modifications may be made within the scope of the present invention.

According to the mask pattern correction method of the present invention, positional deviation of a pattern of a mask by mask deformation due to gravity can be prevented. According to the production method of a semiconductor device of the present invention, a fine pattern can be formed with high accuracy. According to a mask production method of the present invention, a mask with high positional accuracy of a pattern can be produced. According to a mask of the present invention, positional deviation between a transferred pattern and design data can be made small even when flexure of a membrane is inverted at mask pattern drawing and at exposure.

What is claimed is:

1. A mask pattern correction method, including
   a step of creating first position data indicating positions of a plurality of marks when supporting a first thin film having said plurality of marks in a state where a first surface thereof directs upward;
   a step of creating second position data indicating positions of said marks when supporting said first thin film in a state where a second surface thereof directs upward;
   a step of obtaining a transfer function for converting said first position data to said second position data; and
   a step of correcting a mask pattern as a shape of an exposure beam transmission portion to be formed on a second thin film by using an inverse function of said transfer function.

2. A mask pattern correction method as set forth in claim 1, wherein the step of creating said first position data includes
   a step of forming marks on said first thin film, and
   a step of actually measuring positions of the marks formed on said first thin film.

3. A mask pattern correction method as set forth in claim 2, wherein the step of forming marks on said first thin film includes
   a step of applying a resist on said first thin film,
   a step of drawing said marks on said resist by using a charged particle beam, an X-ray, an extremely short wavelength ultraviolet ray or an ultraviolet ray; and
   a step of forming holes as the marks by performing etching on said first thin film by using said resist as an etching mask.

4. A mask pattern correction method as set forth in claim 2, wherein the step of forming marks on said first thin film includes
   a step of applying a resist on said first thin film, and
   a step of drawing said marks on said resist by using a charged particle beam, an X-ray, an extremely short wavelength ultraviolet ray or an ultraviolet ray, to actually measure positions of marks drawn on said resist.

5. A mask pattern correction method as set forth in claim 2, wherein the step of actually measuring positions of marks formed on said first thin film includes a step of measuring coordinates of the marks on said first thin film projected on a plane approximately parallel to said first thin film.

6. A mask pattern correction method as set forth in claim 2, wherein the step of actually measuring positions of marks formed on said first thin film includes
    a step of measuring coordinates with relatively low positional accuracy, the coordinates being defined when marks on said first thin film are projected on a plane approximately parallel to said first thin film,
    a step of measuring heights of marks as positions of said marks in the thickness direction of said first thin film, and
    a step of calculating coordinates from said coordinates, said mark heights and said first thin film thickness with relatively high accuracy, the coordinates being defined when the marks on said first thin film are projected on a plane approximately parallel to said thin film.

7. A mask pattern correction method as set forth in claim 2, wherein the step of actually measuring positions of marks formed on said first thin film includes
    a step of measuring coordinates with relatively low positional accuracy, the coordinates being defined when marks on said first thin film are projected on a plane approximately parallel to said first thin film,
    a step of measuring curvature of said first thin film at respective marks, and
    a step of calculating coordinates from said coordinates, said curvature and said first thin film thickness with relatively high accuracy, the coordinates being defined when marks on said first thin film are projected on a plane approximately parallel to said first thin film.

8. A mask pattern correction method as set forth in claim 1, wherein said first position data is created by a simulation.

9. A mask pattern correction method as set forth in claim 8, wherein the finite element method, the boundary element method or the finite difference method is used for said simulation.

10. A mask pattern correction method as set forth in claim 2, wherein the step of creating said second position data includes
    a step of supporting said first thin film in a state where the second surface thereof directs upward, and
    a step of actually measuring positions of marks formed on said first thin film.

11. A mask pattern correction method as set forth in claim 2, further including
    a step of forming second surface side marks on the second surface side of said first thin film;
    wherein the step of creating said second position data includes a step of supporting said first thin film in a state where the second surface thereof directs upward, and
    a step of actually measuring positions of said second surface side marks.

12. A mask pattern correction method as set forth in claim 2, wherein the step of creating said second position data includes a step of supporting said first thin film in a state where the second surface thereof directs upward, and making said first surface face to an exposure surface,
    a step of irradiating an exposure beam from said second surface side to said first thin film and transferring said marks on said exposure surface by the exposure beam transmitting said marks, and
    a step of actually measuring positions of marks transferred to said exposure surface.

13. A mask pattern correction method as set forth in claim 2, wherein the step of creating said second position data includes
    a step of applying a resist on a wafer;
    a step of supporting said first thin film in a state where the second surface thereof directs upward, and making said first surface face to said resist,
    a step of irradiating an exposure beam from said second surface side to said first thin film and performing exposure and development on said resist;
    a step of forming marks on said wafer by performing etching on said wafer by using said resist as an etching mask; and
    a step of actually measuring positions of marks formed on said wafer.

14. A mask pattern correction method as set forth in claim 1, wherein said second position data is created by a simulation.

15. A mask pattern correction method as set forth in claim 14, wherein the finite element method, the boundary element method or the finite difference method is used for said simulation.

16. A production method of a semiconductor device, including a step of irradiating an exposure beam to an exposure object arranged to face to a first surface of a mask from the second surface side of said mask and exposing a mask pattern formed on said mask to said exposure object, wherein:
    said mask pattern is a pattern corrected by using an inverse function of a predetermined transfer function;
    said transfer function is a function for converting first data to second position data;
    said first position data indicates positions of a plurality of marks when supporting a transfer function determining thin film having said marks in a state where the first surface thereof directs upward; and
    said second position data indicates positions of said marks when supporting said transfer function determining thin film in a state where the second surface thereof directs upward.

17. A production method of a semiconductor device as set forth in claim 16, wherein said mask has holes as exposure beam transmission portions and said holes are formed to be said mask pattern.

18. A production method of a semiconductor device as set forth in claim 16, wherein
    said mask comprises an exposure beam transmission film and an exposure beam block film formed on a part of said exposure beam transmission film, and said exposure beam block film is formed on portions other than said mask pattern.

19. A production method of a semiconductor device as set forth in claim 16, wherein:
    said transfer function determining thin film further comprises exposure beam transmission portions formed to be a different mask pattern from that of said mask; and
    a step of exposing a mask pattern formed on said transfer function determining thin film on said exposure object is furthermore included.

20. A mask production method, including:
    a step of creating first position data indicating positions of a plurality of marks when supporting a first thin film having said marks in a state where a first surface thereof directs upward;
    a step of creating second position data indicating positions of said marks when supporting said first thin film in a state where a second surface thereof directs upward;

a step of obtaining a transfer function for converting said first position data to said second position data;

a step of correcting a mask pattern as a shape of exposure beam transmission portions to be formed on a second thin film by using an inverse function of said transfer function; and a step of producing a mask including a second thin film having exposure beam transmission portions in a corrected mask pattern.

21. A mask production method as set forth in claim 20, wherein
said second thin film has holes as exposure beam transmission portion, and
said holes are formed in a corrected mask pattern.

22. A mask production method as set forth in claim 20, wherein
said second thin film comprises an exposure beam transmission film and an exposure beam block film formed on a part of said exposure beam transmission film; and
said exposure beam block film is formed on portions other than a corrected mask pattern.

23. A mask production method as set forth in claim 20, including
a step of correcting a mask pattern formed on a third thin film being different from a mask pattern formed on said second thin film by using an inverse function of said transfer function; and
a step of forming exposure beam transmission portions on said third thin film in a corrected mask pattern and producing another mask including said third thin film.

24. A mask production method, including:
a step of creating first position data indicating positions of a plurality of marks when supporting a first thin film having said marks and exposure beam transmission portions in a predetermined pattern in a state where a first surface thereof directs upward;
a step of producing a first mask having said first thin film and a thin film supporting portion formed on a second surface side of said first thin film;
a step of creating second position data indicating positions of said marks when supporting said first thin film in a state where the second surface thereof directs upward;
a step of obtaining a first transfer function for converting said first position data to said second position data;
a step of performing exposure for producing a device by supporting said first thin film in a state where the second surface thereof directs upward and irradiating an exposure beam from the second surface side to a first mask;
a step of correcting a mask pattern as a shape of exposure beam transmission portions to be formed on a second thin film by using an inverse function of said first transfer function; and
a step of producing a second mask including the second thin film having a plurality of marks and exposure beam transmission portions in a corrected mask pattern.

25. A mask production method as set forth in claim 24, further including:
a step of creating third position data indicating positions of said marks when supporting a second thin film in a state where the first surface thereof directs upward;
a step of creating fourth position data indicating positions of said marks when supporting said second thin film in a state where the second surface thereof directs upward;
a step of obtaining a second transfer function for converting said third position data to said fourth position data;
a step of performing exposure for producing a device by supporting said second thin film in a state where the second surface thereof directs upward and irradiating an exposure beam from the second surface side to second mask;
a step of correcting a mask pattern as a shape of exposure beam transmission portions to be formed on a third thin film by an inverse function of said second transfer function; and
a step of producing a third mask including a third thin film having a plurality of marks and exposure beam transmission portions in a corrected mask pattern.

26. A mask, having a thin film formed with exposure beam transmission portions in a predetermined pattern, for exposing an exposure beam from a second surface side to an exposure object arranged to face to a first surface of said thin film, wherein:
said pattern is a pattern corrected by using an inverse function of a predetermined transfer function;
said transfer function is a function for converting first position data to second position data;
said first position data indicates positions of a plurality of marks when supporting a transfer function determining thin film having said marks in a state where the first surface thereof directs upward; and
said second position data indicates positions of said marks when supporting said transfer function determining thin film in a state where the second surface thereof directs upward.

* * * * *

UNITED STATES PATENT AND TRADEMARK OFFICE
CERTIFICATE OF CORRECTION

| | | |
|---|---|---|
| PATENT NO. | : 7,109,500 B2 | Page 1 of 1 |
| APPLICATION NO. | : 10/509230 | |
| DATED | : September 19, 2006 | |
| INVENTOR(S) | : Shinji Omori et al. | |

It is certified that error appears in the above-identified patent and that said Letters Patent is hereby corrected as shown below:

Title Page:
Item (54) should be read as follows:
--MASK PATTERN CORRECTION METHOD, PRODUCTION METHOD OF SEMICONDUCTOR DEVICE, MASK PRODUCTION METHOD AND MASK--.

Signed and Sealed this

Twenty-ninth Day of May, 2007

JON W. DUDAS
*Director of the United States Patent and Trademark Office*